(12) United States Patent
Barai et al.

(10) Patent No.: US 8,910,089 B1
(45) Date of Patent: Dec. 9, 2014

(54) PRINTING PROCESS CALIBRATION AND CORRECTION

(71) Applicant: International Business Machines Corporation, Armonk, NY (US)

(72) Inventors: Samit Barai, Bangalore (IN); Alan E. Rosenbluth, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/921,378

(22) Filed: Jun. 19, 2013

(51) Int. Cl.
 *G06F 17/50* (2006.01)
(52) U.S. Cl.
 CPC .................................. *G06F 17/5081* (2013.01)
 USPC .................... 716/51; 716/50; 716/52; 716/53; 716/54; 716/55
(58) Field of Classification Search
 USPC .............................. 716/50, 51, 52, 53, 54, 55
 See application file for complete search history.

(56) References Cited

U.S. PATENT DOCUMENTS

| | | | |
|---|---|---|---|
| 6,563,566 B2 * | 5/2003 | Rosenbluth et al. | 355/67 |
| 8,136,054 B2 | 3/2012 | Chen et al. | |
| 8,694,928 B2 * | 4/2014 | Cao et al. | 716/54 |
| 2002/0140920 A1 * | 10/2002 | Rosenbluth et al. | 355/67 |
| 2005/0094116 A1 * | 5/2005 | Flagello et al. | 355/53 |
| 2006/0007421 A1 * | 1/2006 | Flagello et al. | 355/53 |
| 2009/0210838 A1 | 8/2009 | Al-Imam | |
| 2010/0122225 A1 * | 5/2010 | Cao et al. | 716/4 |
| 2010/0290013 A1 * | 11/2010 | De Metsenaere et al. | 355/30 |
| 2011/0224956 A1 | 9/2011 | Ye et al. | |
| 2012/0017183 A1 * | 1/2012 | Ye et al. | 716/52 |
| 2013/0232457 A1 * | 9/2013 | Ye et al. | 716/53 |

* cited by examiner

*Primary Examiner* — Vuthe Siek
*Assistant Examiner* — Brian Ngo
(74) *Attorney, Agent, or Firm* — Yuanmin Cai; Hoffman Warnick LLC

(57) ABSTRACT

Various embodiments include approaches for calibrating a model for a lithographic printing process. Some embodiments include a computer-implemented method for calibrating a model for a lithographic printing process. Some approaches include: identifying parameters for a model of the lithographic printing process; assembling a population of design content including potentially printable features that can be printed by the lithographic printing process; preparing at least one matrix expressing a similarity between the potentially printable features in terms of the parameters for the model; determining a manifold of smaller dimensionality than the parameters for the model which exhibit maximum variation in similarity within the at least one matrix; and selecting a sample dataset of the potentially printable features from the manifold.

17 Claims, 21 Drawing Sheets

PRINTING PROCESS CALIBRATION AND CORRECTION

TECHNICAL FIELD

Aspects of the invention relate generally to lithographic mask layouts. More particularly, various aspects of the invention relate to calibrating printing process correction models in lithographic printing.

BACKGROUND

Lithography is a known process conventionally used in the manufacture of integrated circuit (IC) devices and their subcomponents. Lithography may be one of a series of processes used to fabricate an IC device. Developing empirical models for performing physical processes such as lithography/printing processes frequently involves the iterative tasks of developing a model, measuring physical data about a product (e.g., a printed product) formed based on the model, and then updating the model according to the measured data. However, developing the model with inaccurate or misinformed data can cause devices that are printed under the guidance of the model to have incorrect dimensions, which in turn can degrade IC performance, or cause outright failure.

For example, current approaches for modeling physical processes in lithographic mask layouts assume that a known form for a process model has been chosen, and implicitly consider this choice to be fixed. These approaches use a specific selection of process model terms to model the lithography/printing process. However, the cost and time required to conduct measurements for calibrating the model(s) can be significant.

BRIEF SUMMARY

Various embodiments include approaches for calibrating a model for a lithographic printing process. In some embodiments, a computer-implemented method for calibrating a lithographic model for a printing process is disclosed. Some approaches include: identifying parameters for a model of the lithographic printing process; assembling a population of design content including potentially printable features that can be printed by the lithographic printing process; preparing at least one matrix expressing a similarity between the potentially printable features in terms of the parameters for the model; determining a manifold of smaller dimensionality than the parameters for the model which exhibit maximum variation in similarity within the at least one matrix; and selecting a sample dataset of the potentially printable features from the manifold (e.g., for use in calibrating and/or correcting the model).

A first aspect includes a computer-implemented method of sampling lithographic content producible by a lithographic printing process, the method performed using at least one computing device, the method including: identifying parameters for a model of the lithographic printing process; assembling a population of design content including potentially printable features that can be printed by the lithographic printing process; preparing at least one matrix expressing a similarity between the potentially printable features in terms of the parameters for the model; determining a manifold of smaller dimensionality than the parameters for the model which exhibit maximum variation in similarity within the at least one matrix; and selecting a sample dataset of the potentially printable features from the manifold (e.g., for use in calibrating and/or correcting the model).

A second aspect includes a computer program product comprising program code on a computer readable storage medium, which when executed by at least one computing device, causes the at least one computing device to sample content producible by a printing process by performing actions including: identifying parameters for a model of the lithographic printing process; assembling a population of design content including potentially printable features that can be printed by the lithographic printing process; preparing at least one matrix expressing a similarity between the potentially printable features in terms of the parameters for the model; determining a manifold of smaller dimensionality than the parameters for the model which exhibit maximum variation in similarity within the at least one matrix; and selecting a sample dataset of the potentially printable features from the manifold (e.g., for use in calibrating and/or correcting the model).

A third aspect includes a system including: at least one computing device configured to calibrate a printing process correction model for a lithographic mask layout by performing actions including: obtaining lithographic feature content in the lithographic mask layout for printing by a lithographic mask using a lithographic printing process; defining dimensions of critical features in the lithographic mask layout to enable the mask to print accurately from the lithographic printing process; identifying parameters for an adjustable model of the lithographic printing process; determining a selection size for a sampling of the critical features to calibrate the adjustable model; preparing at least one matrix expressing a correlation between the critical features and the parameters for the adjustable model; determining a manifold of smaller dimensionality than the set of model parameters which exhibits a corresponding variation in similarity as the at least one matrix; selecting a sample set of approximately equal size to the selection size within the manifold of smaller dimensionality; printing the sample set of features using the lithographic process; comparing printed dimensions of the critical features in the printed sample set with the dimensions of critical features in the lithographic mask layout; and adjusting the lithographic model in response to the comparing indicating that the printed dimensions of the critical features deviate by greater than a threshold amount from the dimensions of the critical features in the lithographic mask layout.

Figure 1:
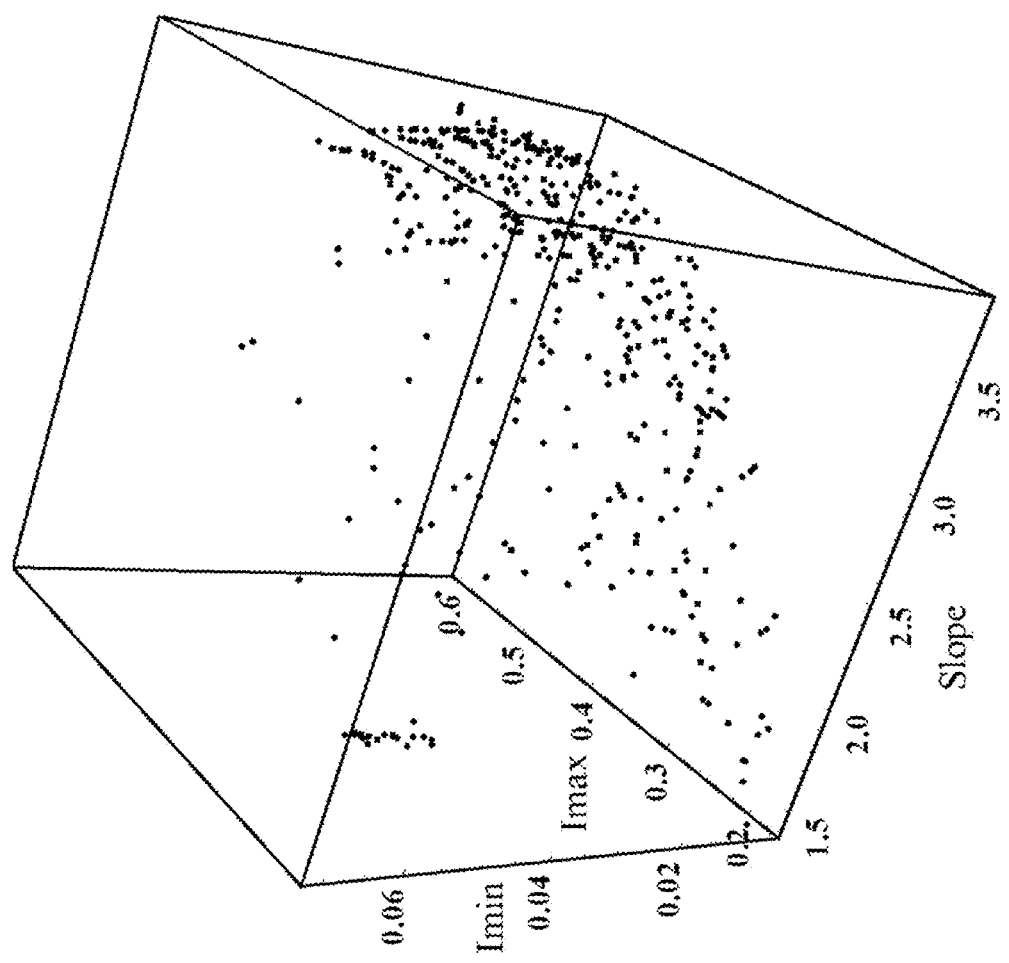
FIG. 1 shows a plot of the coordinates of a sample patterns within a three-dimensional subspace of a full model space.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

This invention relates generally to lithographic mask layouts. More particularly, various aspects of the invention relate to calibrating printing process correction models in lithographic printing, e.g., of layouts for integrated circuits.

As described herein, developing empirical models for performing physical processes such as lithography/printing processes frequently involves the iterative tasks of developing a model, measuring physical data about a product (e.g., a printed product) formed based on the model, and then updating the model according to the measured data. However, developing the model with inaccurate or misinformed data can cause features that are printed under the guidance of the model to have incorrect dimensions, which in turn can degrade performance, or cause outright failure.

Various embodiments of the present invention make it less costly to carry out the measurements that are needed to calibrate the model when compared with the conventional approaches. That is, the invention makes it easier to determine experimentally the most appropriate numerical values for the model parameters that are employed when tuning and combining the model terms. In many cases, the model parameters are simply weights, and the model prediction is simply a weighted sum of the model term values. Model parameters can also tune the specific shape of the model terms, e.g., they can be spatial width parameters.

In practice, according to various embodiments, the model terms are derived (or, chosen) on heuristic grounds. Heuristic model terms are used because the true physics of current integrated circuit patterning processes is too costly to simulate on the scale of an entire IC layout. Because the model terms are heuristic, they do not represent the true physical drivers of the patterning process. With such terms, the model fit will therefore be imperfect, and so the primary criterion for choosing the values of the model parameters is minimization of the model's error when it predicts the (known) results of calibration measurements.

A consequence of this kind of best-fitting criterion is that the set of patterns used to calibrate the model must be made quite comprehensive. This is because parameter values that would successfully yield minimum fitting error when using a set of calibration features having a restricted scope may give very poor predictions when the model is applied to new patterns of a different type (e.g., patterns that are not represented in the narrow calibration data). In other words, models that are empirically calibrated are not expected to extrapolate very well unless their structure closely matches the true physical processes that produce the extrapolated results. Conventional heuristic models only have a loose and qualitative correspondence with the underlying physics of the lithography/masking process, as the process is too difficult to simulate on a large scale.

Unfortunately, comprehensive calibration of conventional process models is not practical. One fundamental obstacle to comprehensive calibration is the high cost of measurement. In general, it is considered fairly straightforward to assemble a large number of patterns (perhaps approximately 1,000 or more patterns) that reasonably represent the diversity that can be encountered in IC chip designs (for a given structural level in a given IC technology type and node). However, it is not practical to take calibration data on thousands of patterns, due to the high cost of measurement. Since the process model may need to be able to predict the size of printed circuit features with an accuracy of about 1 nanometer (nm) or better, the accuracy required of the calibration measurement(s) is quite high, resulting in a very expensive and time-consuming measurement procedure. Conventionally, in order to address this issue, one might set approximately 200 calibration measurements as the practical upper limit, with fewer being preferred.

While the numerical characterizations noted above are merely examples, the importance of the tradeoff is fairly universal in current IC masking/lithography practice. In other words, it is possible to generate as many diverse sample patterns as one wishes in order to encompass the range of IC patterns that might be encountered in a given IC technology, but it is quite costly to actually print such patterns and measure their dimensions. If computationally practical process models were truly physical, one would in theory need only 10 or 20 measurements to determine numerical values for the 10 or 20 adjustable parameters that the models typically employ (though even with physical models the number of measurements could be increased to account for measurement error). However, the inventors recognize that practical models are only heuristic, so the chosen calibration data must be representative of the broad set of possible patterns that might be encountered, making it desirable to measure a much larger number of calibration patterns. Unfortunately, as noted herein, the high cost of dimensional metrology has forced conventional approaches to sample only a small fraction of the set of patterns that would constitute a representative set according to engineering judgment.

It is understood that it can be difficult to choose calibration patterns with a strategy of designing calibration targets whose values for the model terms stand in chosen ratios that are stepped out in a parametric variation. In some cases, it could be undesirable to choose calibration patterns in this manner. The reason is that with realistic patterns the values of the model terms will be highly correlated, and most combinations of values could never arise.

Although the specifics of this restriction of practical possibilities are not known in advance, the inventors have discovered that its existence (which was not clearly identified in the prior art) provides an approach for easing the cost of adequate model calibration, which various embodiments of the invention exploit. This is significant because the underlying physics of the patterning process is often nonlinear. As a result, it would be desirable (if practical considerations permitted) to sample every possible combination of model terms under a reasonably fine gridding, in order to make sure that all possible interactions were being sampled. In the absence of other knowledge, the number of combinations required in such an ideal sampling would increase exponentially with the number of model terms.

For example, to crudely sample as few as two values for each of 20 model terms (e.g., choosing only a large and a small value), the nominal total number of combinations in the 20-dimensional space would be about one million. At a more desirable gridding of 5 samples along each parameter axis, the nominal number of combinations would rise to about 1E14. Unfortunately, it may only be practical to take approximately 200 or so measurements. This is one form of the so-called "curse of dimensionality", which is a phrase that refers to any of a number of different ways in which computational problems become more difficult when a space of high dimension is involved. In the present case (modeling lithography/masking processes in an IC), the curse of dimensionality makes it difficult to sample within a high-dimensioned space of model terms using a purely geometrical approach.

Fortunately, the inventors have discovered that model calibration sampling need not be limited by purely geometrical considerations, because very few combinations of model term values will ever occur in practice. For example, to form a 20-dimensional space in which the coordinates of any pattern are represented by a 20-element list of values, the set of all patterns that could ever be encountered in practice will only populate a very small fraction of the space, and this fraction will be highly filamentary (where "filamentary" in this context means low-dimensioned locally, as with a 1D filament within ordinary 3D space, but where the populated filament can have any dimensionality as long as it is less than that of the full space, i.e., these filaments are not necessarily 1D, as in the literal meaning of filamentary), and fragmented, with the filaments potentially being curved in various ways, and with the separate fragments being dispersed in an initially unknown way.

As noted herein, the inventors have discovered that it may not be particularly difficult to assemble (as data) a set of patterns numbering approximately in the 1000s or so that is reasonably representative of a particular technology (at a given pattern-definition step during IC manufacture). When lists of coordinates corresponding to the associated set of model term values are assigned to each of these patterns as mentioned herein, the sample patterns will populate portions of the full (e.g., 20-dimensional) space as a cloud of points, with most regions of the space remaining empty, but with the points being clustered into various lower-dimensioned regions within the space. In some cases, these populated regions may have a small extent in all (e.g., 20) dimensions, but are mainly spread along manifolds of much lower dimensionality (i.e., the population will occupy filaments that are quite fine in some but not all dimensions), with these manifolds exhibiting slow curvature and irregular boundaries within the full space (i.e., the filaments are often not straight). Multiple such manifolds can be present as separate clusters of point populations.

Figure 2:
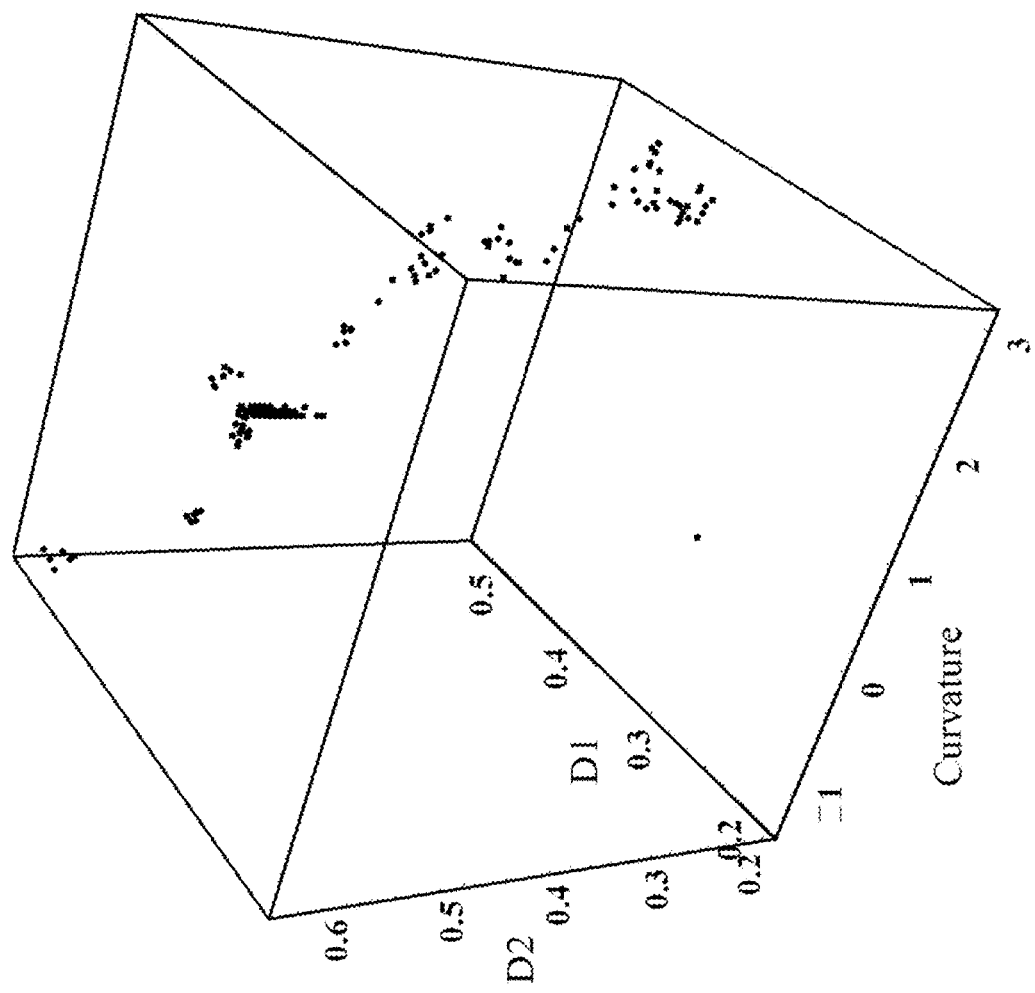
FIGS. 2-4 illustrate distinct three-dimensional subspaces in the same full model space as FIG. 1.

As noted herein, such behavior has been conventionally very difficult to quantify when the number of dimensions is large, due to the complexity of the geometry that is present. FIGS. 1-2 show three-dimensional graphical depictions of calibration data clusters which illustrate some of the issues related with conventional approaches for modeling IC lithography/masking processes.

FIG. 1 shows a plot of the coordinates of approximately 500 sample patterns within a three-dimensional subspace of the full model space (which has 13 dimensions in this example). Only three of these dimensions are used in the example plot in FIG. 1, to make visualization possible.

With continuing reference to FIG. 1, had the full model space included only these three dimensions, it may be relatively easy to plan suitable coverage of this content with calibration data. For example, such coverage could be accomplished by simply laying out a set of (curved) gridlines along the cupped surface formed by the data, and evenly spreading a feasible number (e.g., 200) of choices for measurement on the grid, allowing also for a few additional measurements within the separated clusters. These measurements would have approximately covered the cupped surface formed from the data using a 14×14 grid of samples (as 14 squared is 196). By restricting our sampling to the populated "cupped surface" region we achieve a tighter representation than if we had tried blindly (i.e. geometrically) to sample the entire 3D space (e.g. using a 6×6×6 grid of 216 points), since the 3D space is mostly empty.

Figure 3:
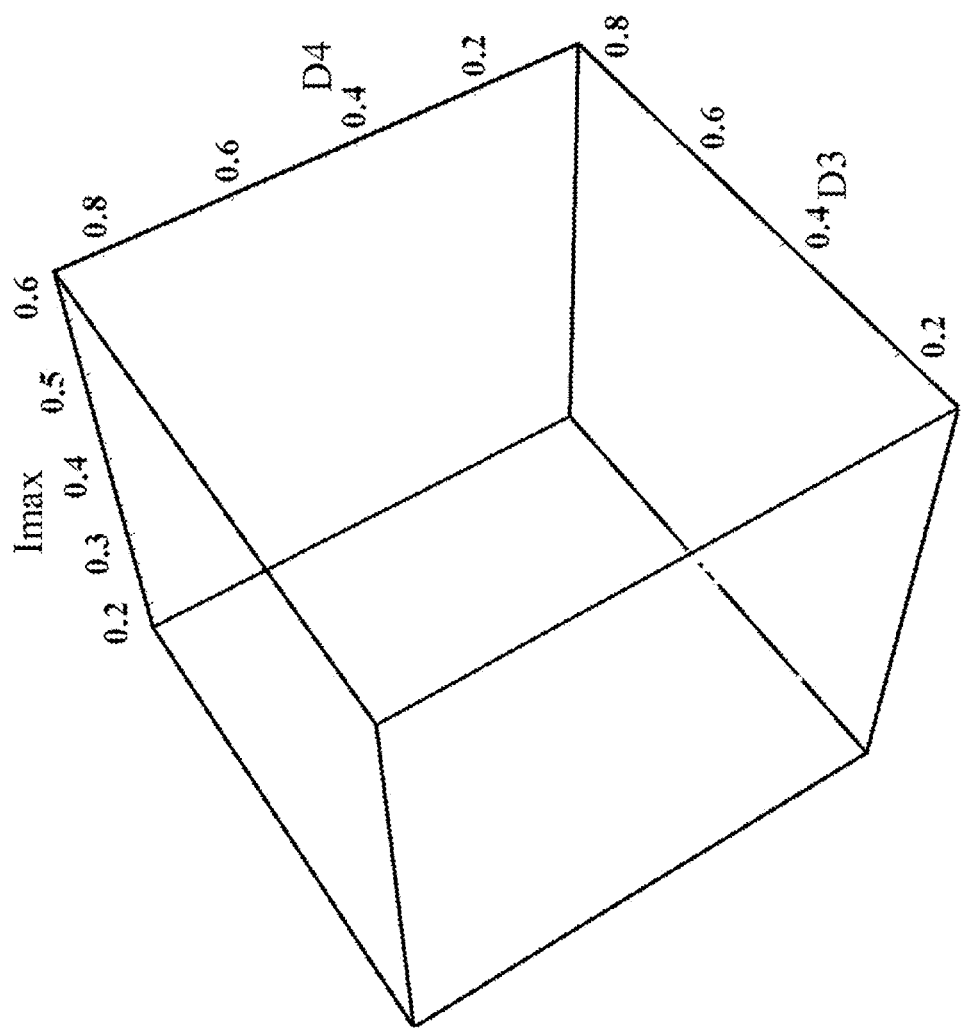
Figure 4:
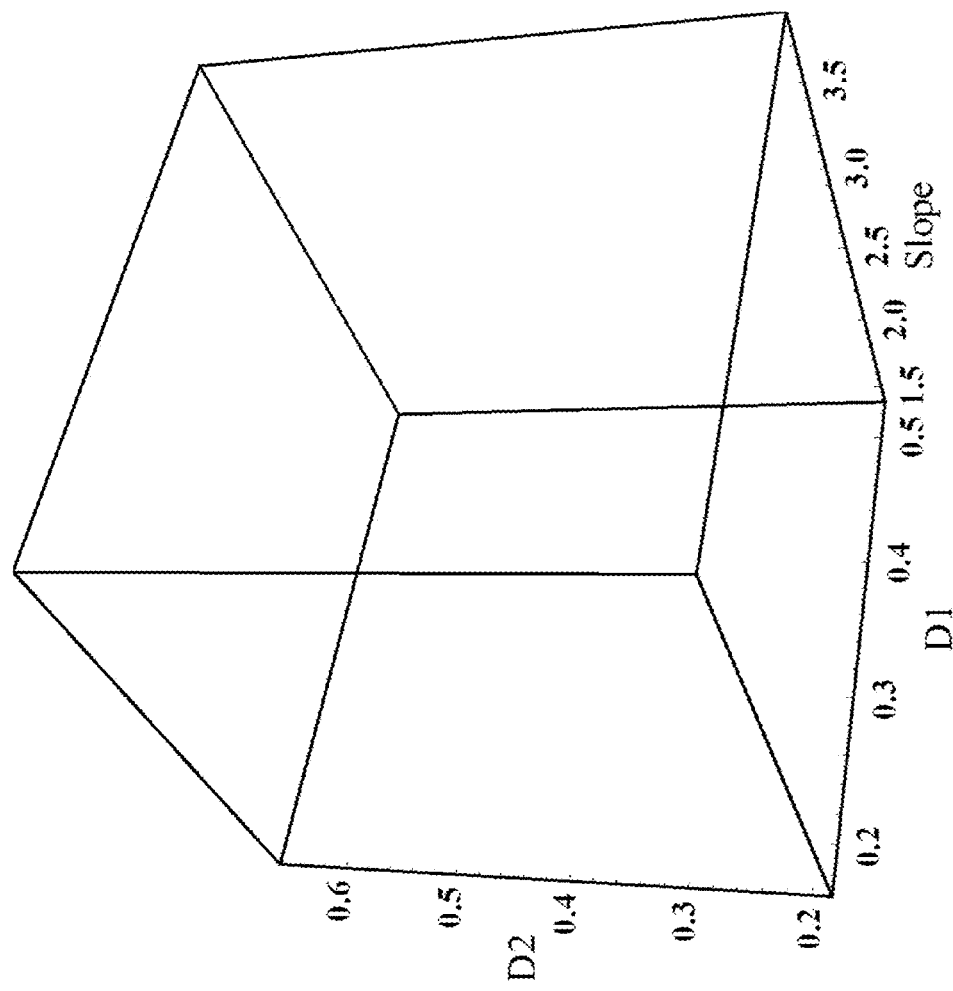

Unfortunately, the number of model terms in the example shown in FIG. 1 is thirteen (13), not three (3), and the data has a non-zero spread within all thirteen of these dimensions. This is illustrated in FIGS. 2-4, which show how the three-dimensional space in FIG. 1 is filled within various 3D subspaces (i.e. projections) that are different from the subspace displayed in FIG. 1 (i.e., choosing different triplets of model terms to project onto). The pattern content shown exhibits a filamentary character in each such perspective (i.e., it mainly occupies curved surfaces or 1D arcs within each chosen 3D subspace in FIGS. 2, 3 and 4, respectively), but the detailed character of these manifolds within the full 13D space is unclear from an assemblage of low-dimensioned plots like these. That is, 286 different 3D triplets could have been chosen from the full 13D space, and intuition is not capable of grasping the entirety of the populated manifold in 13D from these projections.

In order to remedy the shortcomings of the herein-noted conventional approaches, the inventors have devised an approach for calibrating printing process correction models. As explained further herein, it is possible to determine low-dimensioned manifolds which capture the maximum portion possible of the variation (i.e., spread) of points that is present within the full data space representing the process model. If this low-dimensioned manifold is limited to two, three, or in some cases four dimensions, it can be relatively manageable to sample the content. Even within such low-dimensioned manifolds, there will be unpopulated regions, and in low dimension, these unpopulated regions can be identified by visual inspection. This visual inspection approach is not possible in higher dimensions.

As the ½, ⅓, and ¼ roots of 200 are (in round numbers) about 14, 6, and 4 respectively, it is possible for sample points to be laid out within such low-dimensioned sub-manifolds that successfully subdivide the populated regions in a substantially even and uniform fashion that limits the variation in each printing process (where unpopulated regions essentially free up measurement slots for other regions). The low dimensionality makes this comparatively easy (when compared with conventional approaches) because the data can be visualized. Visualization more difficult if the manifold dimensionality is increased further, and the number of steps that can be made along each dimension becomes too small to achieve good coverage. That is, the steps become coarse, and no longer subdivide the manifold in a fine way, due in essence to the curse of dimensionality.

Therefore, according to various embodiments of the invention, the sub-manifold dimensionality may be set at two, three or four, and often not a greater number which would render visual inspection ineffective. In general, according to various embodiments, the sub-manifold dimensionality should be set to a smaller number than the dimensionality of the full model space.

Various embodiments of the invention are directed toward approaches for minimizing/reducing the number of measurements needed to calibrate a lithographic process model for an integrated circuit (IC).

In particular embodiments of the invention a process can include:

1) Reducing an assembled (full) set of representative patterns to a smaller set which encompasses and covers the variation in lithographic content of the full set in an efficient way, where the lithographic content is expressed using the terms of a lithographic process model; and 2) Conducting measurements using the smaller set in order to calibrate the lithographic model.

In various alternative embodiments, however, it is also possible to carry out process 1 of this procedure (reducing assembled data set to smaller data set), and then employ the smaller set for other purposes (aside from the measurement process in process 2). For example, it is possible to numerically optimize certain factors in the lithographic process, e.g., the shape of the light directional distribution which illuminates the mask (referred to as the "source"). Current approaches for source optimization are numerically intensive, so in conventional approaches it has been necessary to design the source using only a very limited selection of patterns. However, various embodiments of the invention can include selecting a set of patterns that can optimize the particular parameters (e.g., source).

In contrast to the above-noted conventional approaches, various embodiments of the invention include computer-implemented methods, computer program products, and computer systems which can sample content producible by a printing process. In some cases, the approaches include: identifying potential parameters for a model of the printing process; assembling a population of design content including potentially printable features that can be printed by the lithographic printing process; preparing at least one matrix expressing a similarity between the potentially printable features in terms of the potential parameters for the model; determining a manifold of smaller dimensionality than the potential parameters for the model which exhibit maximum variation in similarity within the at least one matrix; and selecting a sample dataset of the potential parameters from the manifold (e.g., for use in calibrating and/or correcting the model).

In contrast to the above-noted conventional approaches, various embodiments of the invention include computer-implemented methods, computer program products, and computer systems which can sample content producible by a printing process. In some cases, the approaches include: identifying potential parameters for a model of the printing process; assembling a population of design content including potentially printable features that can be printed by the lithographic printing process; preparing at least one matrix expressing a similarity between the potentially printable features in terms of the potential parameters for the model; determining a manifold of smaller dimensionality than the potential parameters for the model which exhibit maximum variation in similarity within the at least one matrix; and selecting a sample dataset of the potential parameters from the manifold (e.g., for use in calibrating and/or correcting the model).

Various additional embodiments of the invention include computer-implemented methods, computer program products, and computer systems which can sample content producible by a printing process. In some cases, the approaches include: obtaining lithographic feature content in the lithographic mask layout for printing by a lithographic mask using a lithographic printing process; defining dimensions of critical features in the lithographic mask layout to enable the mask to print accurately from the lithographic printing process; identifying parameters for an adjustable model of the lithographic printing process; determining a selection size for a sampling of the critical features to calibrate the adjustable model; preparing at least one matrix expressing a correlation between the critical features in terms of the parameters for the adjustable model; determining a manifold of smaller dimensionality than the set of model parameters which exhibits a corresponding variation in similarity as the at least one matrix; selecting a sample set of size approximately equal to the selection size within the manifold of smaller dimensionality; printing the sample set of features using the lithographic process; comparing printed dimensions of the critical features in the printed sample set with the dimensions of critical features in the lithographic mask layout; and adjusting the lithographic model in response to the comparing indicating that the printed dimensions of the critical features deviate by greater than a threshold amount from the dimensions of the critical features in the lithographic mask layout.

Even further, various embodiments of the invention include computer systems, methods and computer program products which can perform one or more of the functions described herein.

Other particular embodiments include a method (e.g., RET design method) for adjusting illumination distribution used to print a lithographic pattern on a mask. The method can include:

Process PA: assembling lithographic patterns to be printed by the lithographic mask using a lithographic process;

Process PB: defining widths of critical features to be printed with the illuminated mask;

Process PC: identifying variables that represent the available adjustments in the illumination distribution;

Process PD: defining a model characterizing the relationship(s) between the values of the illumination variables and the critical feature widths;

Process PE: identifying trait factors of patterns characterizing the lithographic printing process;

Process PF: choosing a desired size for a sampling of the identified patterns in order to adjust the illumination variables;

Process PG: preparing at least one matrix expressing the similarity of the patterns in terms of the pattern factors;

Process PH: determining a manifold of smaller dimensionality than the set of pattern factors which exhibits maximal variation in similarity within the similarity matrix or matrices;

Process PI: choosing a sample set of desired size within said smaller dimensioned manifold;

Process PJ: providing a merit function expressing the predicted merit value of the printed critical widths of the sampled patterns as predicted by the feature width model; and Process PK: adjusting the values of the illumination variables to maximize the value of the merit function.

In some cases, the process of preparing the similarity matrix (Process PG) can include:

Process PG1: identifying a centering point and a distance metric in the model parameters (or pattern factors) (e.g., in the space of the model parameters);

Process PG2: locating a plurality of critical features in the model parameter space (or pattern factor space) that are referenced by rows and columns of a matrix; and Process PG3: forming the elements of the matrix as two distinct metrics. The product in each element in the matrix is equivalent to the distance between the centering point and the row-referenced feature, multiplied by the distance between the centering point and the column-referenced feature.

In some cases, where the model is a linear model, the coordinates of the centering point in the space of the model parameters (or pattern factors) are formed by averaging each model parameter (or pattern factor) over a sum of all of the critical features. In some cases, the distance metric is a Euclidean distance. In some other cases, the plurality of critical features consists of all of the critical features in the layout.

In further embodiments relating to linear models, the manifold of smaller dimensionality is defined by axes which are eigenvectors of the similarity matrix that have the largest eigenvalues.

As will be described further herein, approaches according to various embodiments of the invention share some common features, e.g., processes such as: a) preparing at least one matrix expressing the similarity of printed features in an IC layout in terms of a set of model parameters; and determining a manifold of smaller dimensionality than the set of model parameters which exhibits maximal variation in similarity within the matrix (or matrices).

Various alternative embodiments can include a computer-implemented method for adjusting illumination distribution used to print lithographic features on a mask, the method including: defining critical feature widths to be printed using the mask; identifying variables to represent available adjustments in the illumination distribution; defining a parameterized model of a relationship between the values representing the available adjustments in the illumination distribution and the critical feature widths; selecting a desired size for sampling of the critical feature widths, the sampling for adjusting the parametrized model; preparing at least one matrix expressing a similarity of the critical feature widths based upon parameters of the parameterized model; determining a manifold of smaller dimensionality than the parameters for the parameterized model which exhibits maximal variation in similarity with the matrix; choosing a sample set of features from the desired size within the smaller dimensioned manifold; providing a merit function expressing predicted printed critical feature widths based upon the parameterized model; and adjusting the values representing the available adjustments in the illumination distribution to enhance the merit function.

Figure 5:
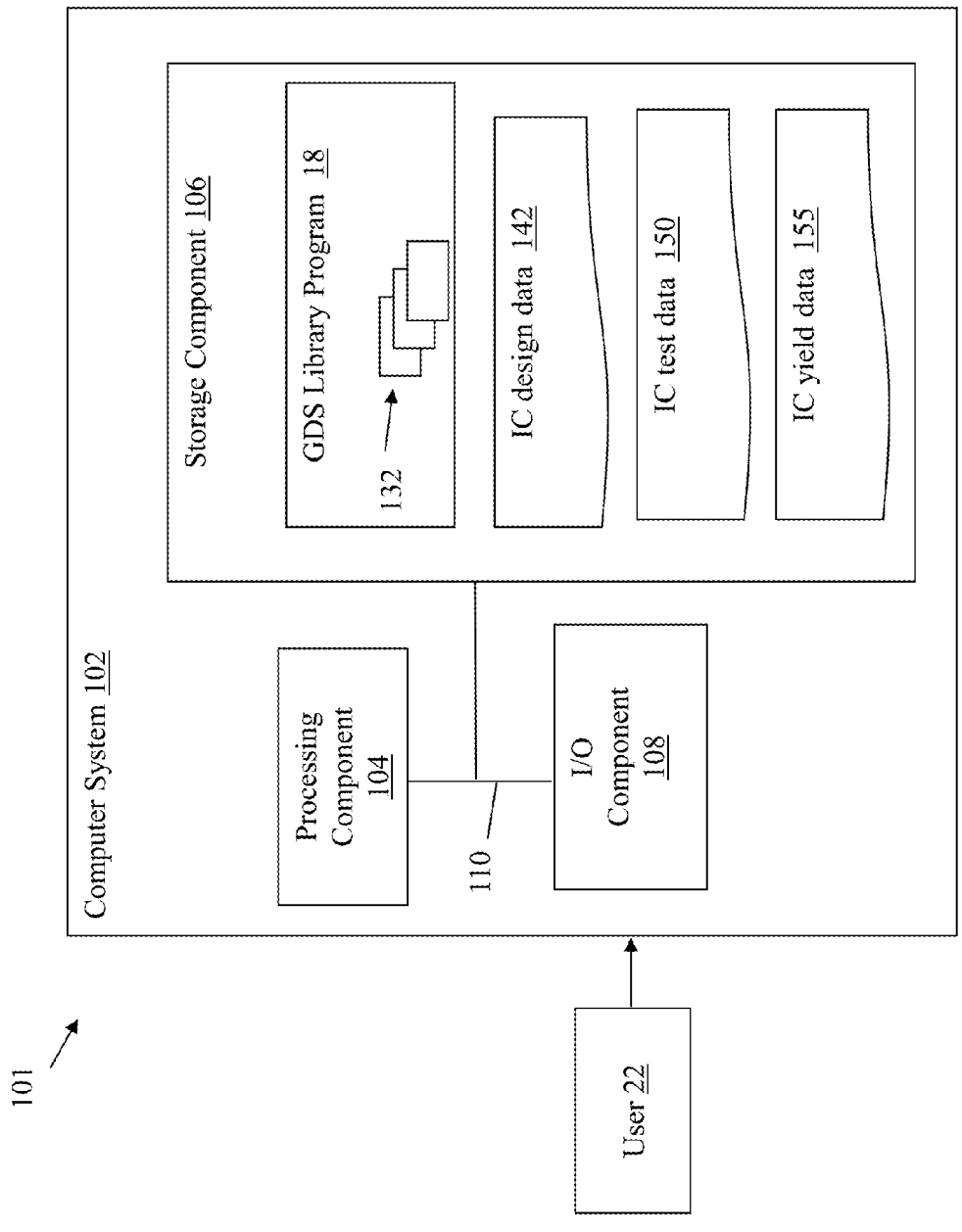
FIG. 5 depicts an illustrative environment for sampling content produced by a printing process, and calibrating a model of that process, according to various embodiments.

FIG. 5 depicts an illustrative environment 101 for sampling content (e.g., portions of an integrated circuit (IC) layout) produced by a printing process (e.g., lithographic printing process), and calibrating a model of that process according to embodiments. To this extent, the environment 101 includes a computer system 102 that can perform a process described herein in order to sample content and/or calibrate a model of the IC layout. In particular, the computer system 102 is shown as including a sampling and calibration program 18, which makes computer system 102 operable to sample content and/or calibrate a model of the IC layout by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the sampling and calibration program 18, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a user (e.g., a human or other user) 22 to interact with the computer system 102 and/or one or more communications devices to enable a system user 22 to communicate with the computer system 102 using any type of communications link. To this extent, the sampling and calibration program 18 can manage a set of interfaces (e.g., graphical user interface(s), application program interface, etc.) that enable human and/or system users 22 to interact with the sampling and calibration program 18. Further, the sampling and calibration program 18 can manage (e.g., store, retrieve, create, manipulate, organize, present, etc.) data, such as IC design data 142, IC test data 150 and/or IC yield data 155 (including wafer and chip-level data) using any solution.

In any event, the computer system 102 can comprise one or more general purpose computing articles of manufacture (e.g., computing devices) capable of executing program code, such as the sampling and calibration program 18, installed thereon. As used herein, it is understood that "program code" means any collection of instructions or algorithms, in any language, code or notation, that cause a computing device having an information processing capability to perform a particular function either directly or after any combination of the following: (a) conversion to another language, code or notation; (b) reproduction in a different material form; and/or (c) decompression. To this extent, the sampling and calibration program 18 can be embodied as any combination of system software and/or application software.

Further, the sampling and calibration program 18 can be implemented using a set of modules 132. In this case, a module 132 can enable the computer system 102 to perform a set of tasks used by the sampling and calibration program 18, and can be separately developed and/or implemented apart from other portions of the sampling and calibration program 18. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of sampling and calibration program 18 fixed thereon (e.g., one or more modules 132). However, it is understood that the computer system 102 and sampling and calibration program 18 are only representative of various possible equivalent computer systems that may perform a process described herein. To this extent, in other embodiments, the functionality provided by the computer system 102 and sampling and calibration program 18 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as IC design data 142, IC test data 150 and/or IC yield data 155 using any solution. For example, the computer system 102 can generate and/or be used to retrieve IC design data 142, IC test data 150 and/or IC yield data 155 from one or more data stores, receive IC design data 142, IC test data 150 and/or IC yield data 155 from another system, send IC design data 142, IC test data 150 and/or IC yield data 155 to another system, etc. IC design data 142 can include data about a layout of an IC, including design parameters such as spacings, tolerances, dimensions (e.g., line widths), intended current levels, etc., IC test data 150 can include data gathered from testing (either through simulation physical testing of product(s)) at least a portion of an IC to verify one or more of the design parameters, and IC yield data 155 can include data such as predicted and/or actual yield data about one or more production processes in the formation of the IC (including chip-level, wafer-level, and/or wafer-level data) or a component of the IC (e.g., one or more chip packages).

While shown and described herein as methods, systems, and computer program products for sampling content and/or calibrating a model of the IC layout, it is understood that aspects of the invention further provide various alternative embodiments. For example, in one embodiment, the invention provides a computer program fixed in at least one computer-readable medium, which when executed, enables a computer system to sample content and/or calibrate a model of the IC layout. To this extent, the computer-readable medium includes program code, such as the sampling and calibration program 18 (FIG. 5), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the sampling and calibration program 18 (FIG. 5), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for sampling content and/or calibrating a model of the IC layout. In this case, a computer system, such as the computer system 102 (FIG. 5), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

Figure 6:
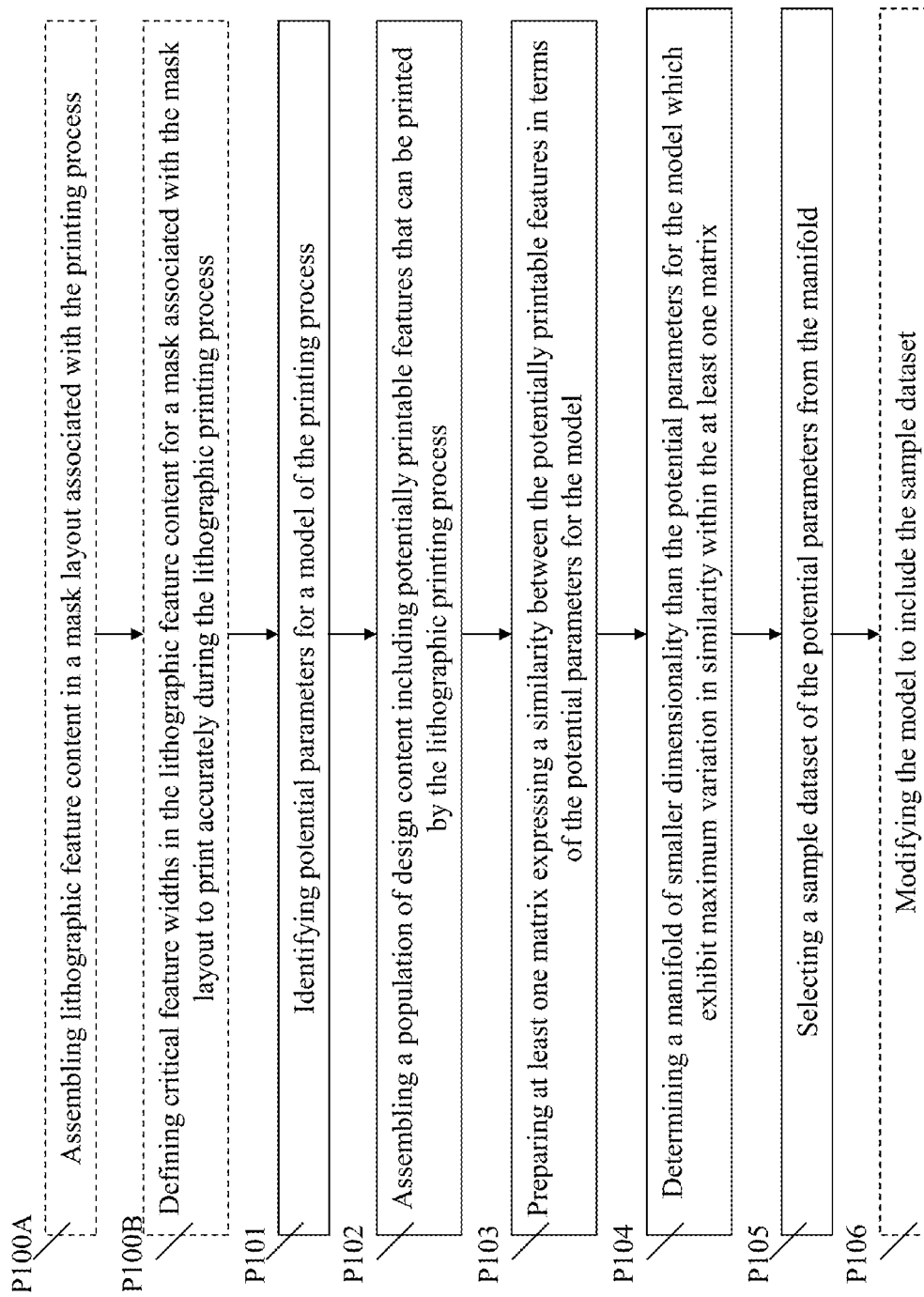
FIG. 6 shows a flow diagram illustrating general processes for sampling content producible by a printing process according to various embodiments of the invention.

FIG. 6 shows a flow diagram illustrating general processes for sampling content producible by a printing process according to various embodiments of the invention. As shown, the method can include the following processes:

Process P101: identifying potential parameters for a model of the printing process. In some cases, the printing process includes a lithographic printing process;

Process P102: assembling a population of design content including potentially printable features that can be printed by the lithographic printing process. In various embodiments, the design content can include design parameters, e.g., parameters described herein;

Process P103: preparing at least one matrix expressing a similarity between the potentially printable features in terms of the potential parameters for the model. In some cases, the preparing of the at least one matrix expressing the similarity between the potentially printable features includes preparing a sub-matrix for each potentially printable feature. In these cases, the sub-matrix expresses a similarity between the printable feature and all printable features neighboring the printable feature;

Process P104: determining a manifold of smaller dimensionality than the potential parameters for the model which exhibit maximum variation in similarity within the at least one matrix; and Process P105: selecting a sample dataset of the potentially printable features located within the manifold (e.g., for use in calibrating and/or correcting the model).

Various embodiments include additional processes, e.g.:

Process P100A (prior to Process P101): assembling lithographic feature content in a mask layout associated with the printing process;

Process P100B (prior to Process P101, after Process P100A): defining critical feature widths in the lithographic feature content for a mask associated with the mask layout to print accurately during the lithographic printing process; and Process P106 (optional additional process after process P106): modifying the model to include the sample dataset.

Figure 7:
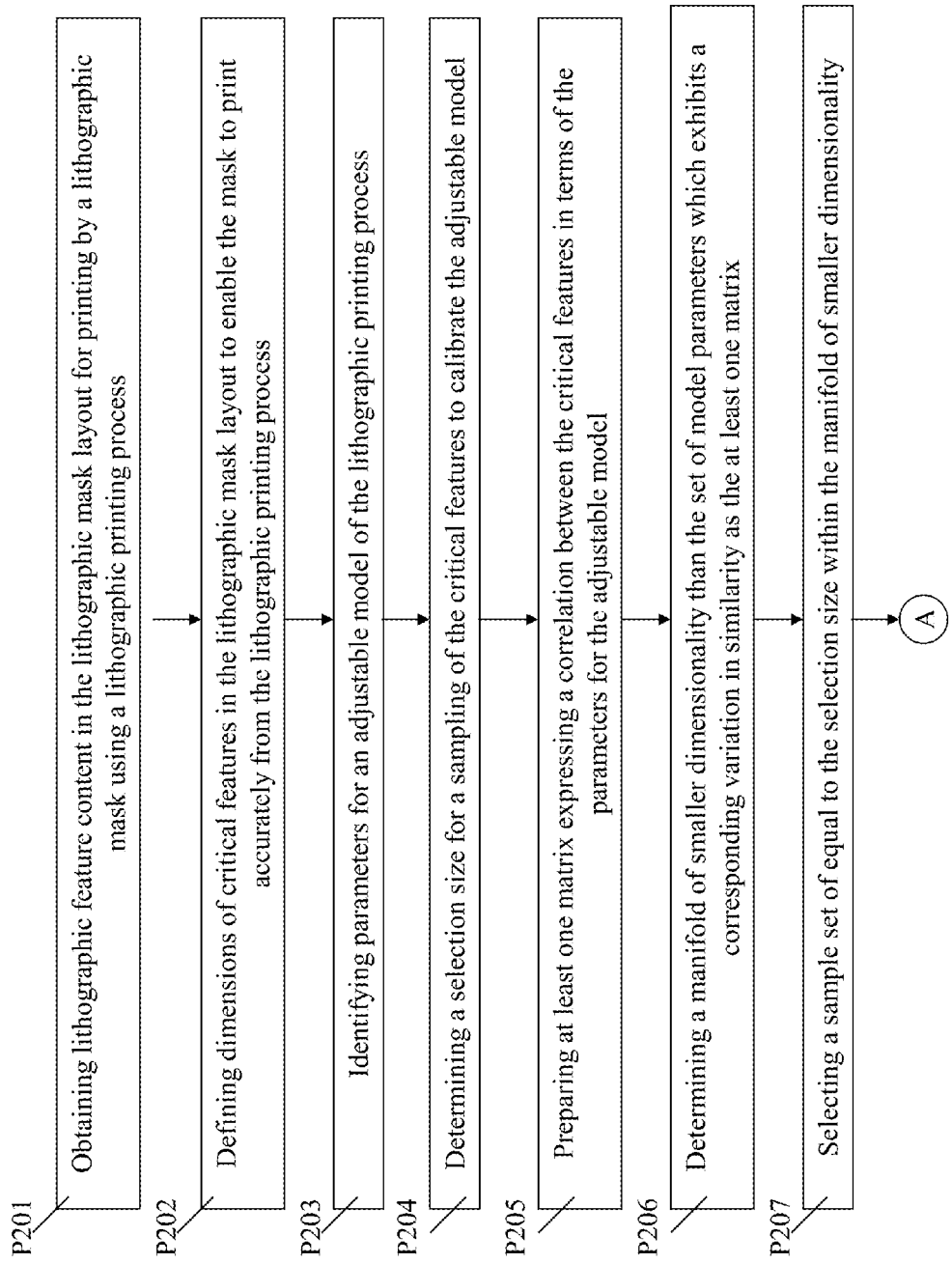
FIGS. 7-8 show a flow diagram illustrating general processes for calibrating a printing process correction model for a lithographic mask layout according to various embodiments of the invention.
Figure 8:
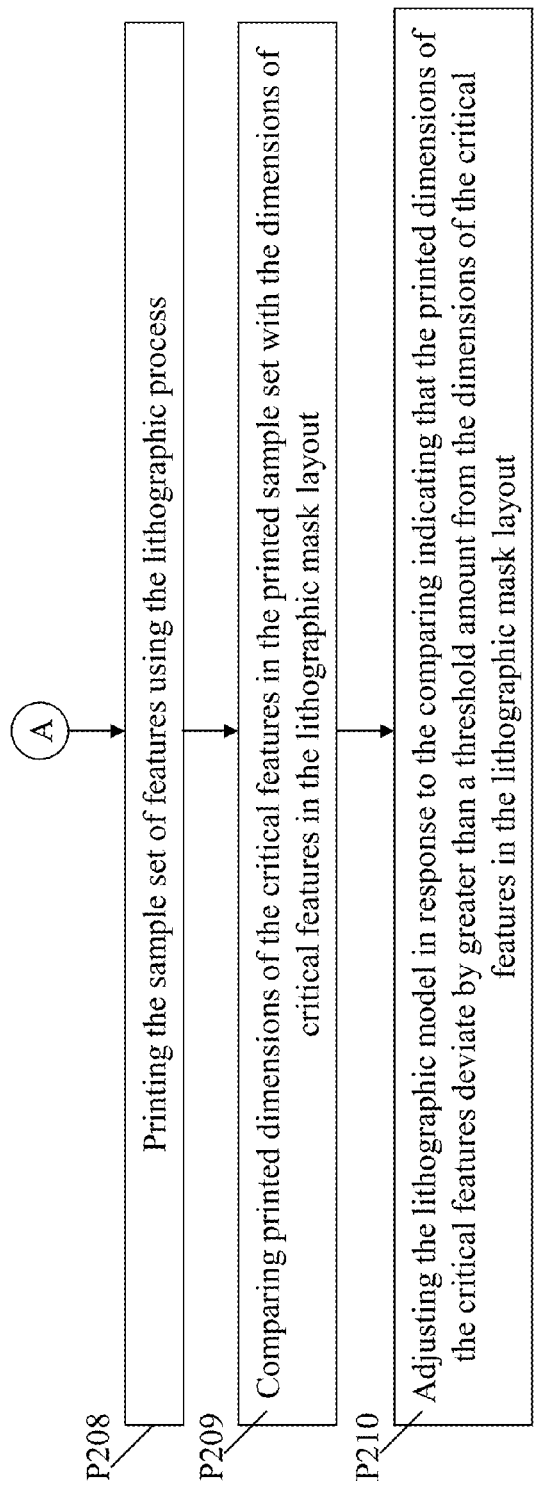

FIGS. 7-8 show a flow diagram illustrating general processes for calibrating a printing process correction model for a lithographic mask layout according to various embodiments of the invention. As shown, the method can include the following processes:

P201: obtaining lithographic feature content in the lithographic mask layout for printing by a lithographic mask using a lithographic printing process;

P202: defining dimensions of critical features in the lithographic mask layout to enable the mask to print accurately from the lithographic printing process. In some cases, the critical features include critical widths in the lithographic mask layout;

P203: identifying parameters for an adjustable model of the lithographic printing process;

P204: determining a selection size for a sampling of the critical features to calibrate the adjustable model;

P205: preparing at least one matrix expressing a correlation between the critical features in terms of the parameters for the adjustable model;

P206: determining a manifold of smaller dimensionality than the set of model parameters which exhibits a corresponding variation in similarity as the at least one matrix. In some cases, the corresponding variation includes a corresponding maximum variation in similarity. Additionally, in some embodiments, the manifold of smaller dimensionality is defined by axes which are the eigenvectors of the at least one matrix that have the largest eigenvalues;

P207: selecting a sample set of equal to the selection size within the manifold of smaller dimensionality;

P208: printing the sample set of features using the lithographic process;

P209: comparing printed dimensions of the critical features in the printed sample set with the dimensions of critical features in the lithographic mask layout; and P210: adjusting the lithographic model in response to the comparing indicating that the printed dimensions of the critical features deviate by greater than a threshold amount from the dimensions of the critical features in the lithographic mask layout. In some embodiments, the threshold amount is based upon a predetermined tolerance associated with the critical features.

EXAMPLES

Linear Model

In some example embodiments, where the model (e.g., the lithographic model) is linear or near-linear, and the manifold segments occupied by lithographic images show little curvature, it is possible to use a covariance matrix to express content similarities within a large population of images.

Figure 9A:
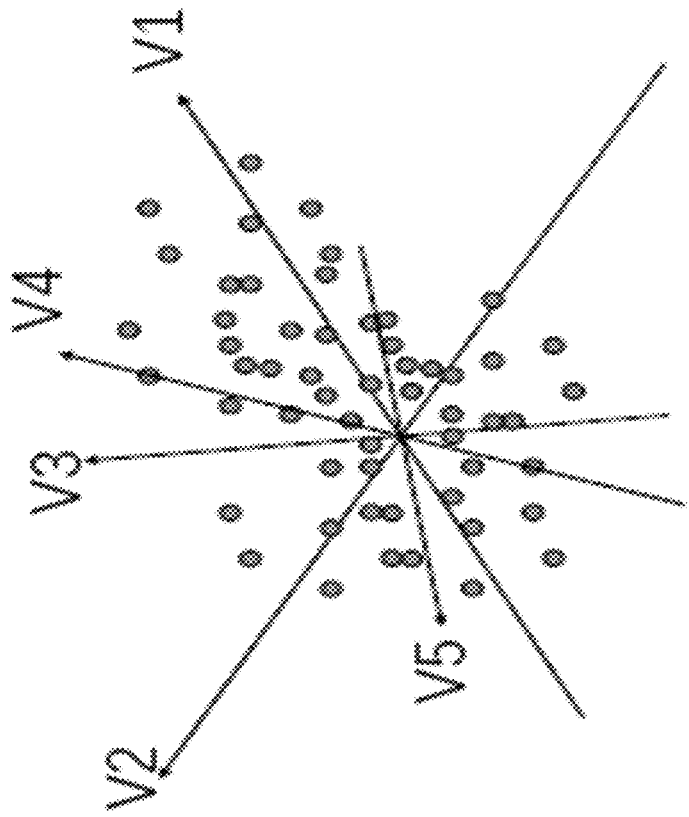
FIG. 9A shows an example eigenvector graph formed within a populated model space according to various embodiments of the invention.
Figure 9B:
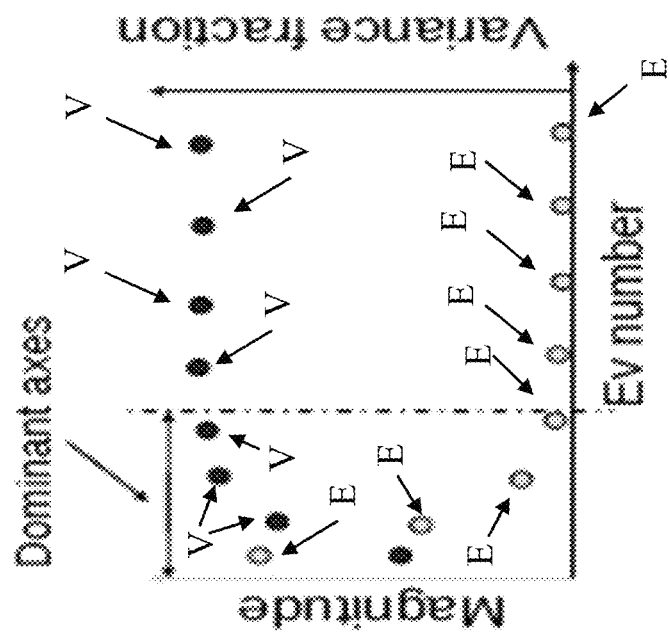
FIG. 9B shows a graphical depiction of eigenvalue magnitude and variance fraction versus eigenvalue number (Ev) number for the eigenvector graph of FIG. 9A.

In the linear (or near-linear) model example, various embodiments can include the following processes:

P311: Calculate model parameters for all candidate samples;

P312: Place the model parameters in a matrix X having zero mean columns;

P313: Form a covariance matrix $S=X^T X$, and calculate eigenvalues and eigenvectors of matrix S. Examples of the covariance matrix and calculation graph are illustrated in FIGS. 9A and 9B, respectively. As shown, eigenvalues (dots labeled "E") in FIG. 9B and the eigenvectors (vector lines V1, V2, etc.) represent values in the matrix S. Vector V1 has the highest variance, V2 has the next highest variance, V3 the next highest, etc. Each dot in FIG. 9A corresponds to a single feature of potentially printable design content, and each dot is positioned in the figure with coordinates given by the values of parameters in a lithographic process model that obtain for the particular feature. The summation of the eigenvalues represents the complete variance in the data, and eigenvectors with higher eigenvalues are considered statistically more significant axes of variation/similarity. For this reason a manifold of relatively small dimensionality that is formed from the eigenvectors of largest eigenvalue can reproduce much of the variation in pattern similarity that is present within the full space of model parameters.

Process P314 includes determining the dominant component(s) (e.g., axis or axes and eigenvector(s)), as illustrated in the graphical depiction of magnitude v. eigenvalue (Ev) number in FIG. 9B. FIG. 9B also includes a plot of accumulated variance fraction (labeled as V), showing, for example, that the three most dominant eigenvectors can together encompass about 95% of the variance that is seen in the full model space.

Figure 10A:
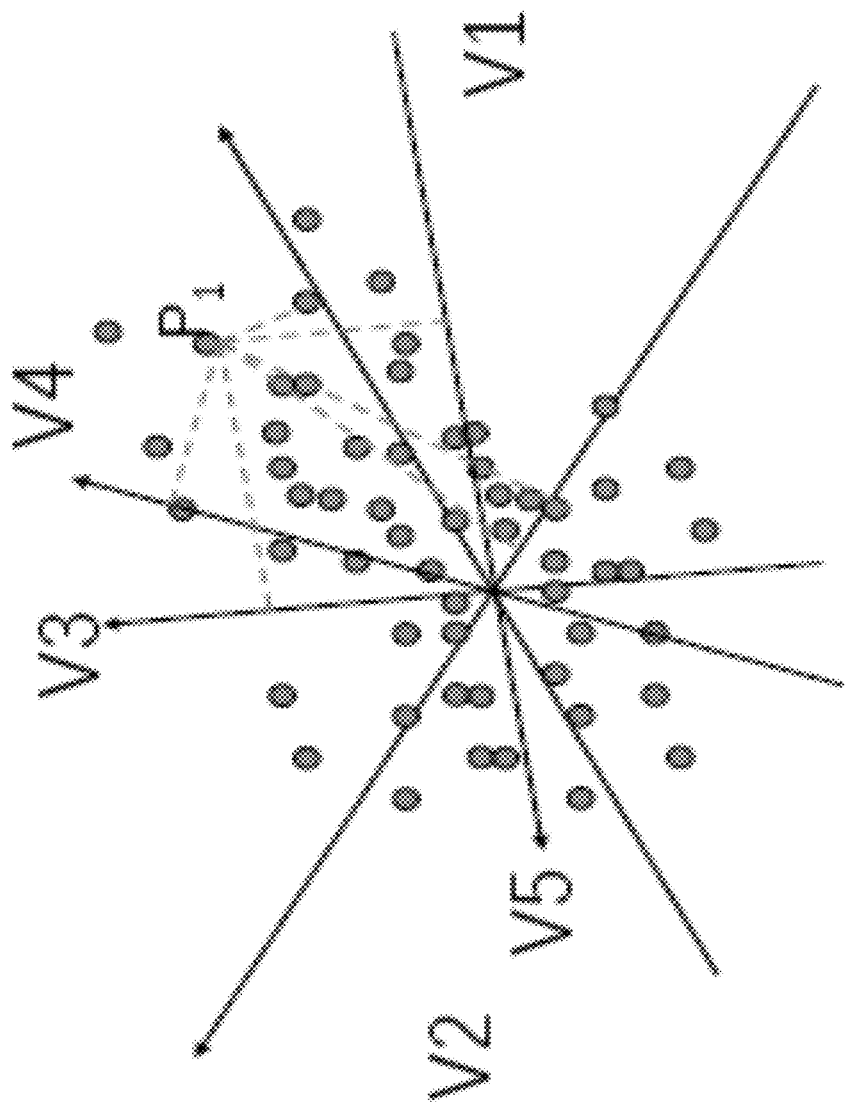
FIG. 10A shows the eigenvector graph of FIG. 9A with overlying Euclidean distance measurements.
Figure 10B:
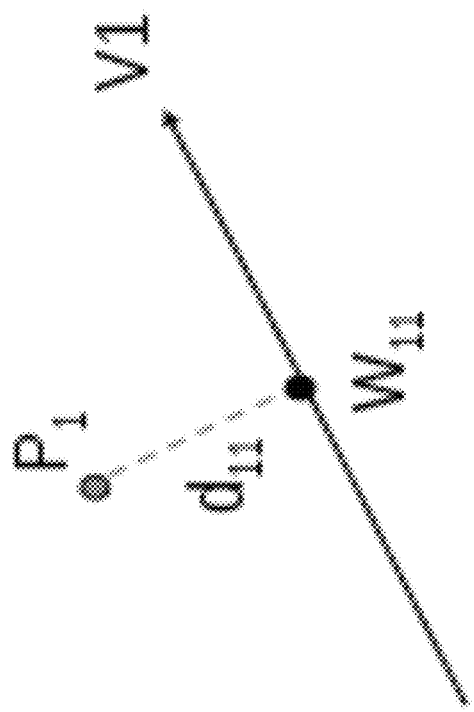
FIG. 10B shows a close-up depiction of an eigenvector (V1) and Euclidean distance measurement from FIG. 10A.

Process P315 includes calculating Euclidean distances of every point (P) from all of the eigenvectors. FIG. 10A shows the eigenvalue and eigenvector graph of FIG. 9A with overlying Euclidean distance measurements, while FIG. 10B shows a close-up depiction of an eigenvector (V1) and Euclidean distance measurement. The following distance matrix can be formed from the Euclidean distance measurements:

$$\text{Distance matrix} = \begin{pmatrix} d_{11} & d_{12} & d_{13} & \ldots & d_{1p} \\ d_{21} & d_{22} & d_{23} & \ldots & d_{2p} \\ & & \ldots & & \\ d_{n1} & d_{n2} & d_{n3} & \ldots & d_{np} \end{pmatrix} \quad \text{(Equation 1)}$$

The distance of measurement $P_m$ from axis $V_q$ is determined by the following:

$$W_{mq} = (V_q \cdot P_m / |V_q|^2) * V_q \quad \text{(Equation 2)}$$

$$d_{mq} = |P_m - W_{mq}| \quad \text{(Equation 3)}$$

Process P316 can include re-arranging entries of columns in the distance matrix (Equation 1) in ascending order, and obtaining a location matrix.

Figure 11:
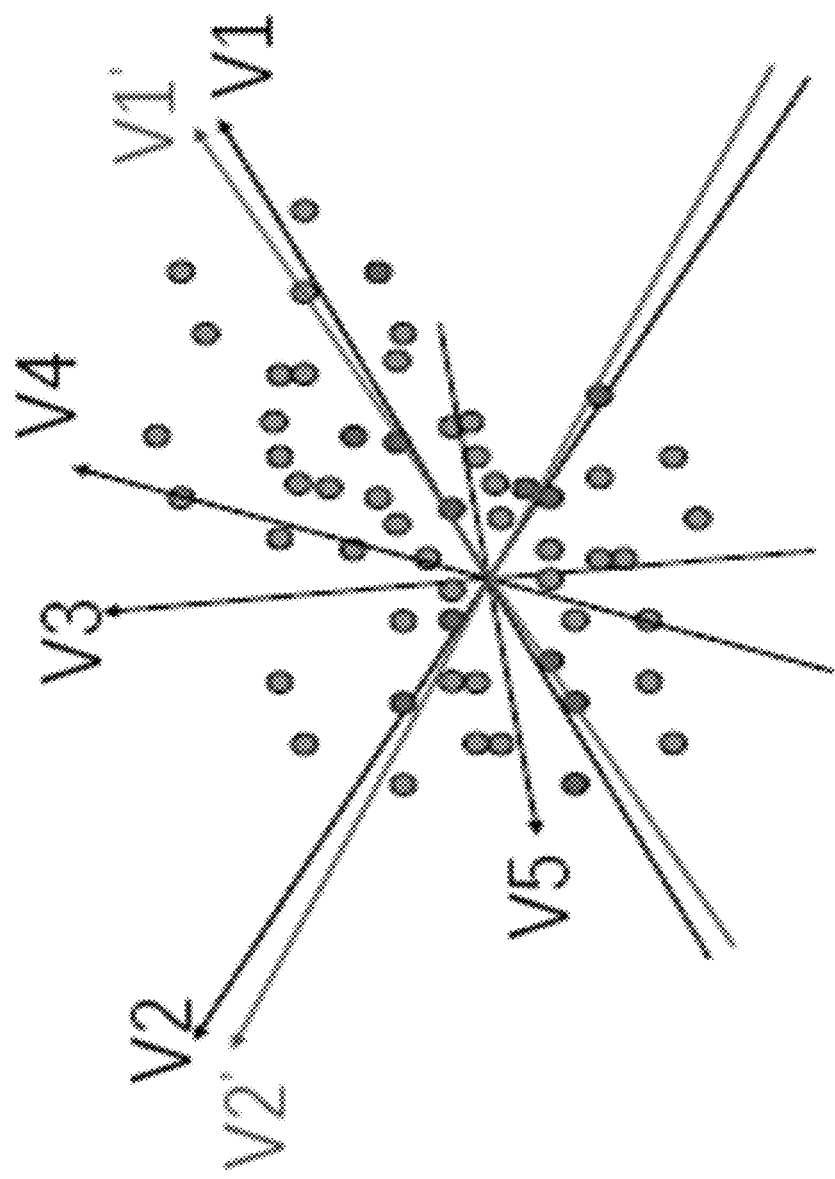
FIG. 11 shows eigenvalues and eigenvectors (V1', V2') of a reduced population overlying the eigenvector graph of FIG. 9A, illustrating the process of finding a dataset with dominant axis that are substantially aligned with the original dominant axes of the covariance matrix.

Process P317 can include finding a minimum dataset that has dominant axes substantially aligned with the original dominant axes of the covariance matrix (via statistically selected samples). FIG. 11 shows eigenvalues and eigenvectors (V1', V2') overlying the covariance matrix of FIG. 9A, illustrating the process of finding a dataset with dominant axis that are substantially (closely) aligned with the original dominant axes of the covariance matrix.

Figure 13:
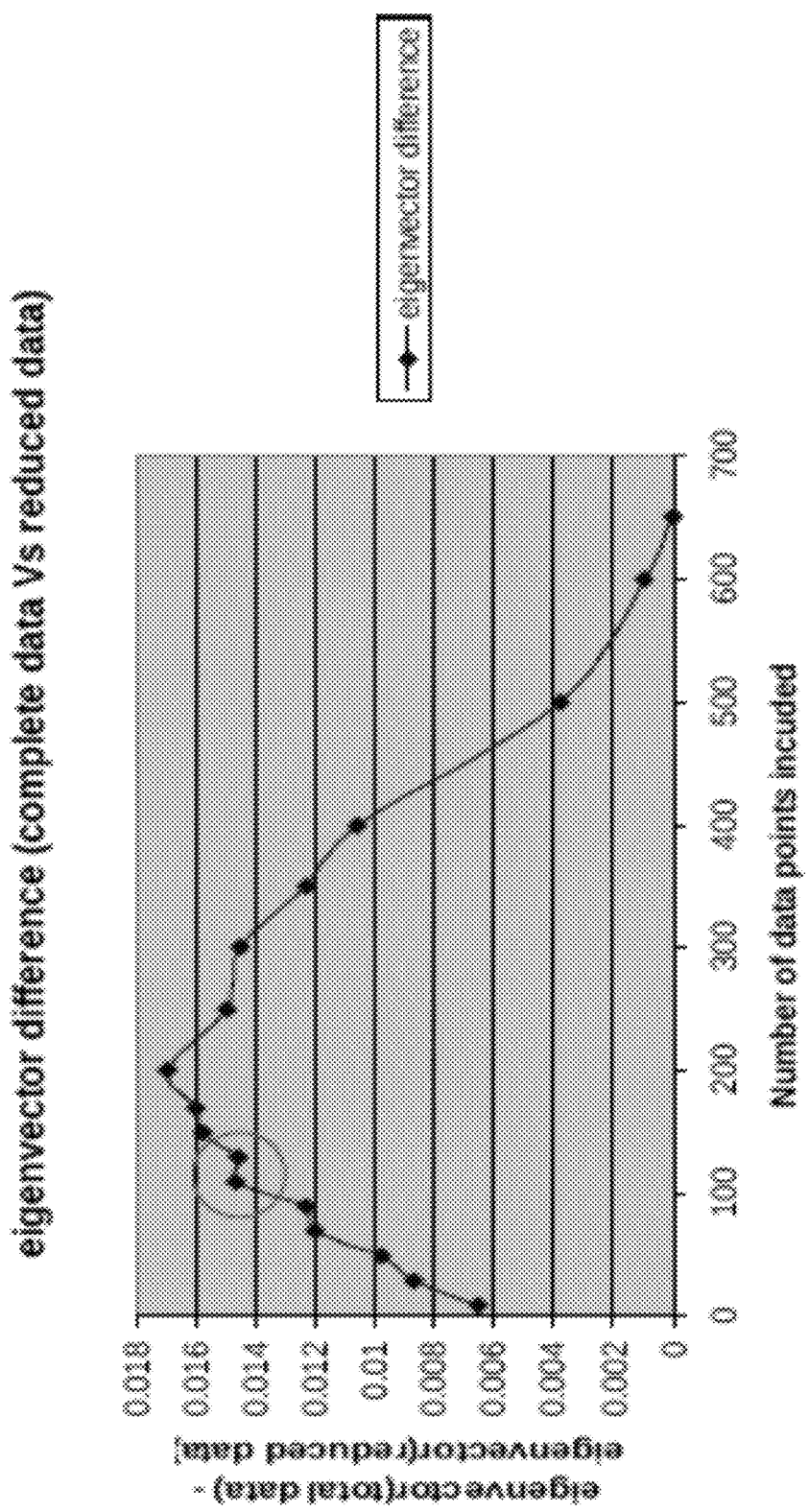
FIG. 13 shows an example eigenvector difference graph (differential graph) for the data shown in FIG. 11, which shows complete model data versus reduced model data.

Process P317 can include a plurality of sub-processes, which can include:

Process P317A: generating a dataset with a number (e.g., r) closest points to V1;

Process P317B: calculating matrix S' for this reduced dataset;

Process P317C: determining new eigenvectors from the matrix S' and comparing the new eigenvectors with the original eigenvectors for matrix S;

Process P317D: repeating processes P317A-C by increasing the value of r;

Process P317E: repeating P317A-317D for V1, V2, V3 ... Vp;

Process P317F: using an eigenvector difference graph (e.g., a graphical representation of the eigenvectors versus number of data points in the matrix, as seen in FIG. 13), selecting a point on the curve where the difference is relatively low and the number of data points is sufficient to provide an accurate representation of the model; and selecting all data below this data point.

Process P317G: repeating 317F for V1, V2, V3 ... Vp.

Process P317H: find the union of all selected data from 317A-317G.

Figure 12:
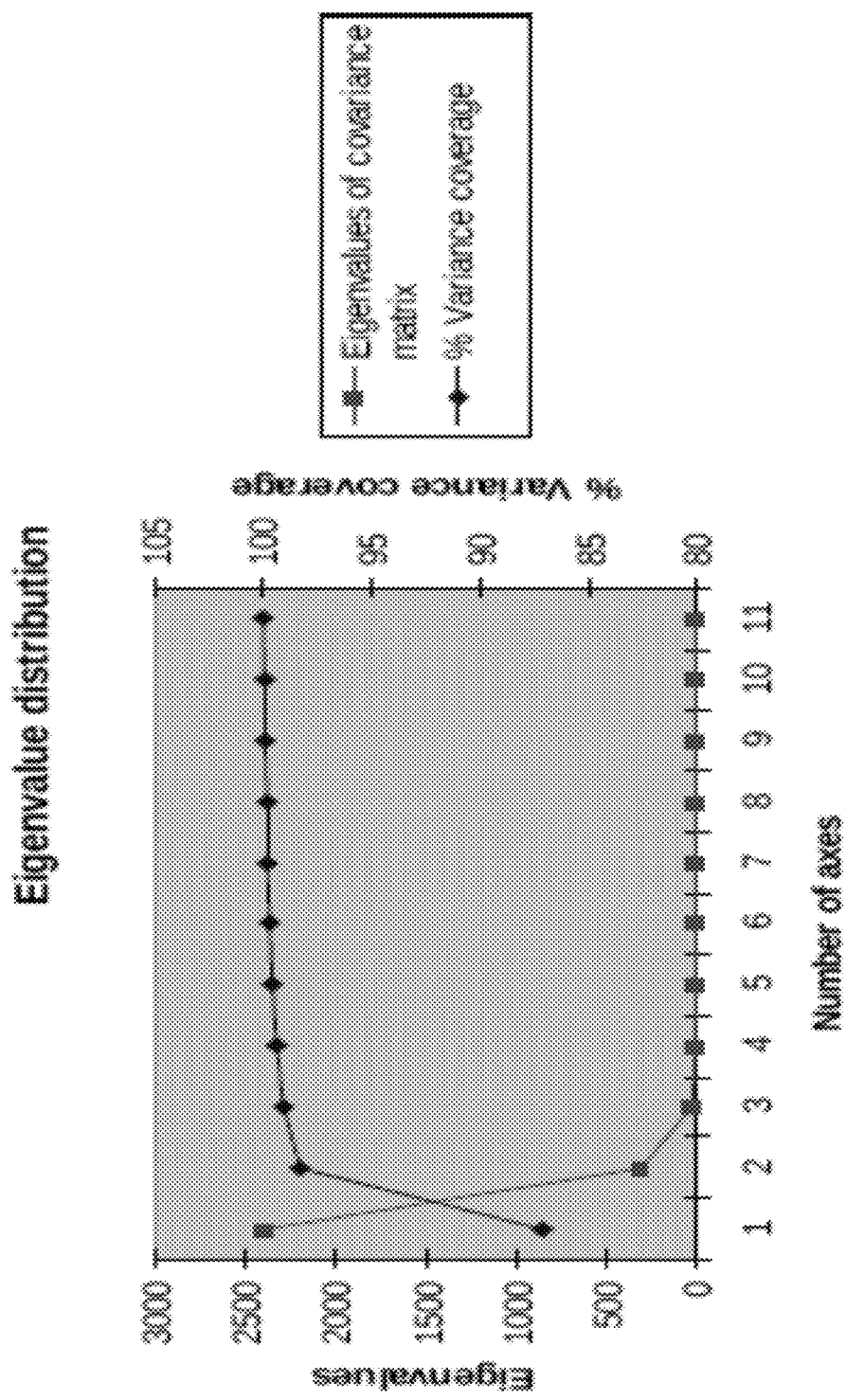
FIG. 12 shows an example eigenvalue distribution graph, including a graphical depiction of eigenvalue magnitude and percentage covariance coverage versus number of axes, according to various embodiments of the invention.

FIG. 12 shows an example eigenvalue distribution graph, including a graphical depiction of eigenvalues v. number of axes v. percentage covariance coverage. As the number of axes increase, the magnitude of the eigenvalues from the covariance matrix decreases. Parameters defining the model space for this eigenvalue distribution graph include Imin, Imax, slope, D1, D1, ... D8. Further, in this example, the number of dominant axis can be reduced from an initial number to a reduced number (e.g., from 11 dominant axes to 3 dominant axes) by means of process P317.

FIG. 13 shows an example eigenvector difference graph (differential graph) for the data shown in FIG. 11, which shows complete model data versus reduced model data. In particular, the eigenvector difference graph shows the differential between complete eigenvector data and reduced eigenvector data versus the number of data points (r) included in the model. In this example, the selected number of data points (r=150) is highlighted with a circle.

Figure 14:
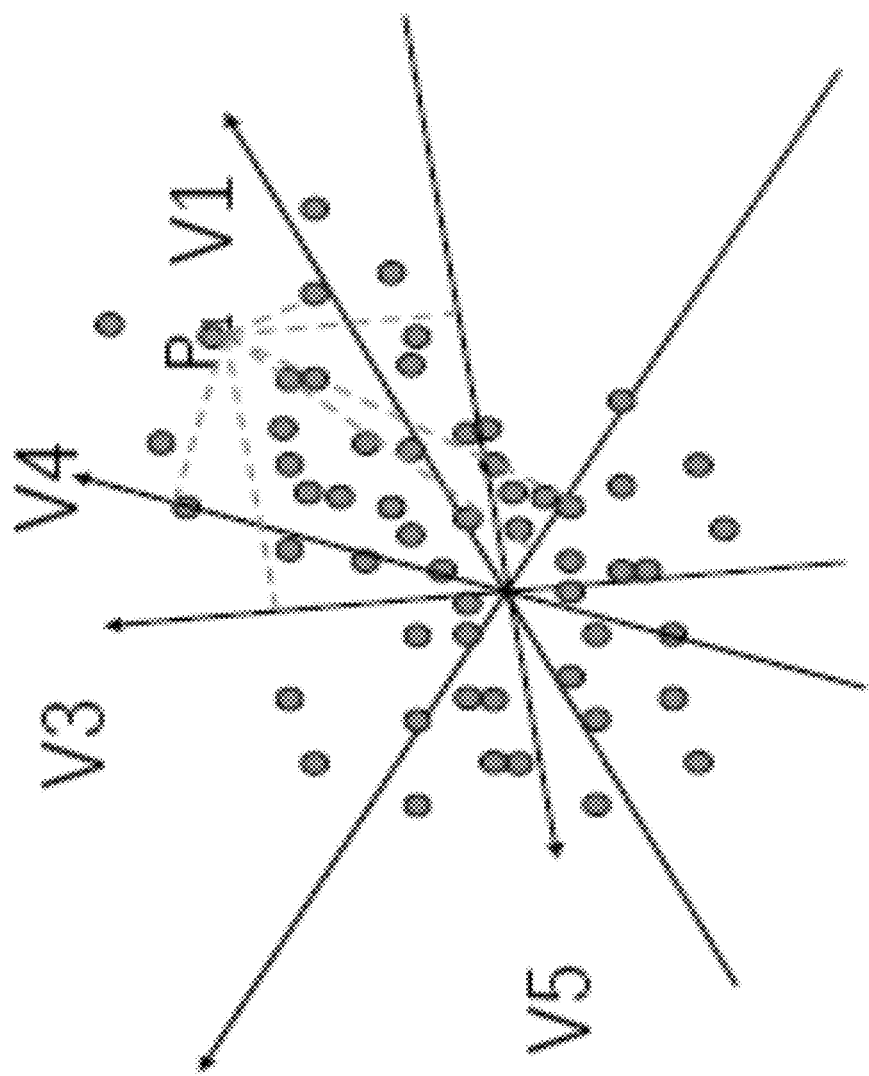
FIG. 14 shows an example eigenvector graph with overlying distance measurements from a single point (e.g., Pi) to all dominant axes.

Various alternative embodiments include performing data selection based upon eigenspace coverage, e.g., calculating a closeness metric of every point from all dominant axes. FIG. 14 shows an example eigenvector graph with overlying distance measurements from a single point (e.g., Pi) to all dominant axes. In this case, the closeness of a particular point can be represented as (Equation 4):

$$closeness_i = \sum_{m=1}^{P} w_m d_{i,m}(P_i, V_m) \ \forall i = 1, 2 \ldots n$$

Where, $w_m$ is the weight assigned to an axis. In these embodiments, the data can be sorted based upon closeness to a dominant axis, and a reduced dataset can be chosen from the data within that range. This approach can be used, e.g., on linear models of lithographic processes.

Figure 15:
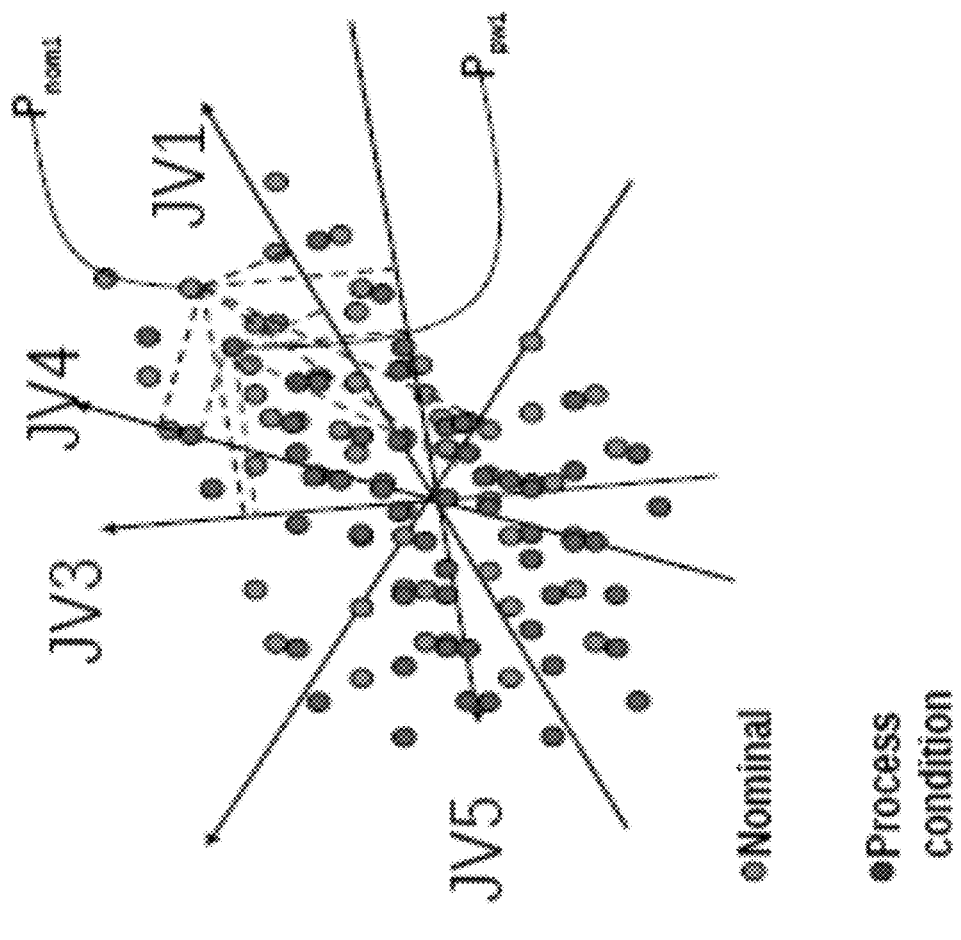
FIG. 15 shows another example embodiment including joint eigenvectors for use in selecting a process window for a model.

FIG. 15 illustrates another example embodiment where joint eigenvectors can be used to aid in selecting a process window for the model. This may be appropriate when measurements are available at both nominal and off-nominal conditions, in which case the joint eigenvectors for a plurality of covariance matrices may be employed. For this embodiment, joint eigenvectors (JV1, JV2, JV3, JV5 ... etc.) are shown in FIG. 15. In these embodiments, the process can include: a) calculating covariance matrices for nominal and process window data ($S_{nom}$, $S_{pc1}$, $S_{pc2}$, ... $S_{pcn}$); b) calculating the dominant approximate joint eigenvectors of these covariance matrices ($JV_1, JV_2, \ldots JV_p$); c) calculating a closeness metric of every point from all dominant axes, according to the following formula for closeness (Equation 5):

$$closeness_i = \sum_{pc} \sum_m w_m d_{i,m}(P_{pci}, Jv_m) \ \forall i = 1, 2 \ldots n$$

Following the calculating in process (c), process (d) can include sorting the model data based on the closeness, and choosing a reduced data set from the entire closeness range.

In some cases, the joint eigenvector approach for selecting process window data can be extended to a multi-corner heuristic. In these cases, the process can include: i) calculating an approximate covariance matrix for the process window data according to:

$$S_{pc} = (S_{pc1} + S_{pc2} + \ldots + S_{npc})/npc \quad \text{(Equation 6)}$$

Where, npc=number of process conditions.

Process (ii) can include calculating joint eigenvectors JV (columns of JV can be equivalent to eigenvectors) of Snom and Spc, where:

$$Jv = Q_1 D_0^{-1/2} Q_2$$

$Q_1$=eigenvector($S_{nom}$) $D_0$=eigenvector($S_{nom}$).
$Q_2$=eigenvector(C) $C = D_0^{-1/2} Q_1 S_{pc} Q_1 D_0^{-1/2}$ Process (iii) can include calculating a closeness metric of every point from all dominant axes, according to the following closeness equation (Equation 7):

$$closeness_i = \sum_m w_m d_{i,m}(P_{nom}, Jv_m) + \sum_m w_m d_{i,m}(P_{pci}, Jv_m)$$

$$\forall i = 1, 2 \ldots n$$

Process (iv) can include sorting data based on its closeness (from Equation 6), and choosing a reduced data set from the entire closeness range.

EXAMPLES

Globally Varying Sub-Manifolds for Nonlinear Models

When processes are described by nonlinear models, the invention can use similarity matrices whose comparisons each cover individually only a portion of the population of potentially printable features. These covered population portions may overlap from row to row within a matrix, collectively covering the entire population of potentially printable features, and the sub-manifold of lower dimensionality that is derived as output can likewise be expressed differently from one part of the population to the next, allowing it to capture dominant axes of similarity variation even when these axes change over the full space. One way to determine such varying sub-manifolds is by so-called Local Linear Embedding (LLE) methods. The output of an LLE may take the form of a low dimensioned set of coordinates that are assigned to each potentially printable feature, and the input may take the form of high dimensioned coordinates of the feature within the full model space, with similarity weights being constructed from these inputs.

For example, in an LLE each local similarity matrix might take the form of weights that make the best fit possible of the high dimensioned model parameter coordinates of each potentially printable feature in terms of the parameter coordinates of the most closely neighboring potentially printable features within the full space. These weights express the similarity relationships that exist between nearby features in the space. In mathematical terms, if $x_{j,m}$ represents the value of the mth model parameter for the jth feature, then we can define the elements $S_{i,k}$ in the ith row of similarity matrix S as those weights which minimize the following Lagrangian equation (Equation 8):

$$L_i = \sum_{\text{Coordinates } m} \left( x_{i,m} - \sum_{\text{Neighbors } k}^{K} S_{i,k} x_{k,m} \right)^2 + \lambda_i \left( 1 - \sum_{\text{Neighbors } k} S_{i,k} \right)$$

which is referred to as an input Lagrangian. The coordinates may be scaled such that the mean and variance of each coordinate across all features are 0 and 1 respectively. The elements of similarity matrix S are referred to as similarity weights. Minimization of the input Lagrangian causes the similarity weights to satisfy as closely as possible the relationship (Equation 9):

$$x_i \cong \sum_{\substack{\text{Neighbors } k \\ \text{surrounding } i}} S_{i,k} x_k$$

which is referred to as a similarity relationship.

The constraint in $L_i$ with multiplier $\lambda$ specifies that the ith row weights which fit feature $x_i$ must sum to 1. The total number of nearest neighbors K that are included in the weighted representation of each feature (thereby defining the number of columns in S) should generally be larger than the desired dimensionality of the output low-dimensional sub-manifold, and should be large enough to encompass a neighborhood whose size exceeds minor deviations in coordinates x, where minor refers to deviations that are regarded as too small for the model to be expected to fit, or that are the result of numerical approximations in computing the model parameters, i.e. deviations which could be regarded as "noise".

LLE determines each row of similarity matrix S (such as the ith) by setting to 0 the gradient of $L_i$ with respect to the column variables $S_{i,k}$. In a basic LLE embodiment, this solution can be expressed as a linear equation involving the local covariance matrices $C^{[i]}$, where the local covariance matrix for the ith potentially printable feature includes products of the Euclidean separations in the full model space of the feature with its K nearest neighbors in the space. One term in the product across any row of $C^{[i]}$ may be the separation of the ith feature from a particular neighboring feature assigned to that row, and likewise the other term in the product may be the separation of the ith feature from a particular neighboring feature assigned to the particular column of the matrix. In mathematical terms, the element of $C^{[i]}$ in row k' and column k" may therefore be defined as according to the following (Equation 10):

$$C^{[i]}_{k',k''} = \sum_{\text{Coordinates } m} (x_{i,m} - x_{k',m})(x_{i,m} - x_{k'',m})$$

As discussed herein, it may be preferable to modify the basic LLE by reducing the rank of $C^{[i]}$ to match the reduced dimensionality of the desired output sub-manifold. If this modification is employed the $C^{[i]}$ used in the invention will no longer be a pure covariance matrix.

Also, it may be preferable to regularize each $C^{[i]}$ matrix, for example by adding to it the identity matrix multiplied by a small weight, such as the square root of machine precision. When rank-reduction of $C^{[i]}$ is employed any non-zero value may be used for the weight, so long as the regularization term is kept very small relative to the primary quadratic term at points well away from the solution. The chosen weight will be designated $\epsilon$. It should be noted that regularization is particularly important when K is larger than the full dimensionality of the space. When regularized, the input Lagrangian becomes (Equation 11):

$$L_i^{(reg)} = \sum_{\text{Coordinates } m} \left( x_{i,m} - \sum_{\text{Neighbors } k} S_{i,k} x_{k,m} \right)^2 +$$
$$\lambda \left( 1 - \sum_{\text{Neighbors } k} S_{i,k} \right) + \varepsilon \sum_{\text{Neighbors } k} S_{i,k}^2$$

In the case of a pure LLE solution, the weights $S_i$ in each row of the similarity matrix are then obtained from $C^{[i]}$ as (Equation 12):

$$S_i = \frac{[(C^{[i]})^T C^{[i]}]^{-1} (C^{[i]})^T e}{e^T [(C^{[i]})^T C^{[i]}]^{-1} (C^{[i]})^T e}$$

Here e designates a column vector in which every element is 1, and superscript T designates the transpose operation.

The weights $S_i$ reflect the similarity of $x_i$ to its neighbors in the high-dimensioned model space, whereas the desired output of the LLE is a set of low-dimensioned coordinates that reproduce as much of the similarity structure in S as possible. If it had been the case that $x_i$ and its neighbors already fit perfectly within a low-dimensional space, then only a few values of $S_i$ would have been needed to express the local similarity. As an extreme example, if $x_i$ and its neighbors were extended along a local filament that was purely one-dimensional, i.e. if these points were found to be laid out along an ideal line, then it would have been possible to express $x_i$ in terms of only two of its immediate neighbors, i.e., (Equation 12):

$$x_i = S_{i,1} x_{i-1} + [1 - S_{i,1}] x_{i+1}$$

with the single independent degree of freedom being (Equation 13):

$$S_{i,1} = (x_{i+1,m} - x_{i,m}) / (x_{i+1,m} - x_{i-1,m})$$

However, the coordinates $x_i$ are in a high-dimensioned model space, and can only be expected to fall within a local low dimensioned manifold in an approximate way, so the similarity weights $S_{i,k}$ for the ith feature may be K in number, and the similarity relationship that the weights satisfy may in general have K terms in its sum. To complete the LLE one must therefore derive low-dimensioned coordinates $v_i$ that match the dominant similarities within the globally varying $S_i$ as closely as possible when assigned to the potentially printable features, essentially as replacements for the high dimensioned $x_i$.

Another consideration may arise when $C^{[i]}$ is a pure covariance matrix, namely that the values obtained when solving for the $S_i$ may be impacted by small local deviations in the $x_i$ that are deemed too small and intricate for the model to realistically fit, for example if these deviations arise from numerical approximations in computation. For this reason it can be desirable to modify the LLE by replacing $C^{[i]}$ with a low-rank approximation to the pure covariance matrix, for example a matrix whose rank is reduced to the desired low dimensionality of the output sub-manifold (this dimensionality being denoted Q). Such a low-rank replacement can be obtained by carrying out an eigen-decomposition of the pure covariance matrix, and then removing all but the Q largest eigen-elements before reconstituting the $C^{[i]}$ matrix (which is thereby reduced in rank).

Once $C^{[i]}$ is modified in this way, any linear combination of the removed eigenvectors will successfully drive the quadratic term in the input Lagrangian entirely to zero, since these removed eigenvectors are orthogonal to the retained eigenvectors. However, the regularized input Lagrangian $L^{(reg)}$ contains a second quadratic term (namely the norm of the $S_{i,k}$ added with weight factor $\epsilon$) which should be minimized by the linear combination of removed eigenvectors, subject to the constraint that the sum of the weights $S_{i,k}$ be unity. This follows because the regularization weight $\epsilon$ is made extremely small, meaning that the primary term must be held essentially to zero at the solution whenever the constraints permit.

Thus, in this embodiment the solution for the weights will take the form:

(Equation 14)

$$S_{i,k} = \sum_{n=Q+1}^{K} \alpha_{n-Q} E'_{k,n-Q}$$

where E' is a matrix whose columns are the deleted eigenvectors of the rank-reduced covariance matrix, and where the $\alpha_n$ are the initially unknown coefficients of the linear combination. (The prime mark on E' emphasizes that this matrix does not include the eigenvectors that are retained in $C^{[i]}$, and likewise the $\alpha$ coefficients only span the range of excluded eigenvectors.)

Minimizing the non-zero terms of the regularized input Lagrangian with respect to the $\alpha$, one then finds that the desired weights are given by (Equation 15):

$$S_i = \frac{E'E'^T e}{\|E'^T e\|^2}$$

To complete the LLE one may next derive low-dimensioned coordinate vectors $v_i$ (each coordinate vector being of length Q) that reproduce as closely as possible the dominant similarities in matrix S. Low dimensioned coordinates $v_i$ are preferably assigned to each potentially printable feature. Each vector of low dimensioned coordinates forms one row of a matrix V, with $V_{i,q}$ being the optimum value of the qth coordinate assigned to potentially printable feature i within the low-dimensioned manifold. The low dimensioned V coordinates must be as closely compatible with the similarity relationships that define the S weights as possible, and this compatibility must obtain in every low-dimensioned coordinate, so that the elements of V in any column q must therefore minimize the Lagrangian (Equation 16):

$$L'_q = \sum_{\text{Points } i}\left(\left[V_{i,q} - \sum_{\substack{\text{Neighbors } k \\ \text{surrounding } i}} S_{i,k[i]} V_{k[i],q}\right]^2\right) + \lambda'_q\left[1 - \sum_{\text{Points } i} V_{i,q}^2\right]$$

which is referred to as an output Lagrangian.

Here $\lambda'_q$ is a multiplier for a constraint which normalizes the squared sum of each low-dimensioned coordinate across the features, in order to prevent the V elements from being driven homogeneously to 0. Neighbor index k in L' has been written as an explicit function of the feature index i to emphasize that each feature has a different set of neighbors.

To facilitate differentiation of the output Lagrangian with respect to the v coordinates it is convenient to reorganize the neighbor-originated similarities in the $S_i$ weights by defining an expanded sparse square matrix S' of size equal to the number of potentially printable features, with the element of S' in the ith row and kth column being set equal to $S_{i,k[i]}$, and with the elements of all non-neighboring columns in row being set to zero.

Minimization of the output Lagrangian then becomes equivalent to solving an eigenvalue problem, with the (q+1)st eigenvector typically forming a list of the qth coordinates of the low-dimensioned set of output sample points. More specifically, the low-dimensioned coordinates are formed from the eigenvectors of a matrix M defined as (Equation 17):

$$M \equiv [I-S']_T[I-S']$$

These eigenvectors should be orthonormalized in the usual way in order that the constraint in the output Lagrangian be satisfied. To minimize the output Lagrangian one must choose the smallest eigenvalues, bearing in mind, however, that the Lagrangian will always have zero as its smallest eigenvalue, corresponding to a coordinate axis along which all potentially printable features lie at the same coordinate. Since a constant-valued coordinate is not useful for sample selection it should be discarded, with the eigenvector of the next smallest eigenvalue typically forming the list of coordinates along the dominant dimension in the low-dimensioned manifold, and so forth.

Figure 16:
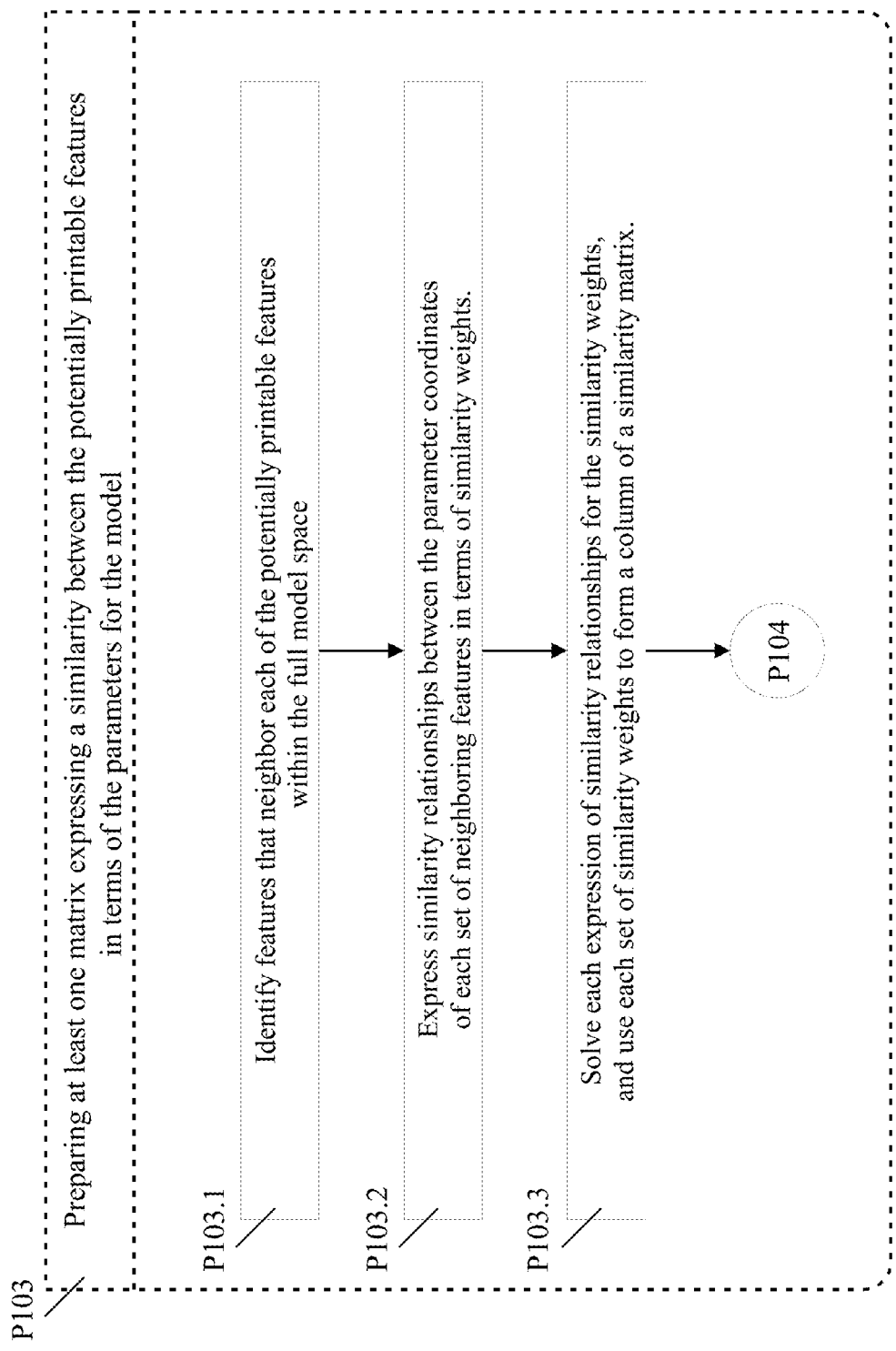
FIG. 16 shows a flow chart illustrating a method according to various embodiments.

FIG. 16 shows a flow chart illustrating a more detailed method of performing the process of preparing at least one matrix expressing a similarity between the potentially printable features in terms of the parameters for the model (Process P103, FIG. 6), according to various embodiments. Process P103 can include the following sub-processes:

Process P103.1: Identify features that neighbor each of the potentially printable features within the full model space;

Process P103.2: Express similarity relationships between the parameter coordinates of each set of neighboring features in terms of similarity weights; and Process P103.3: Solve each expression of similarity relationships for the similarity weights, and use each set of similarity weights to form a column of a similarity matrix.

Figure 17:
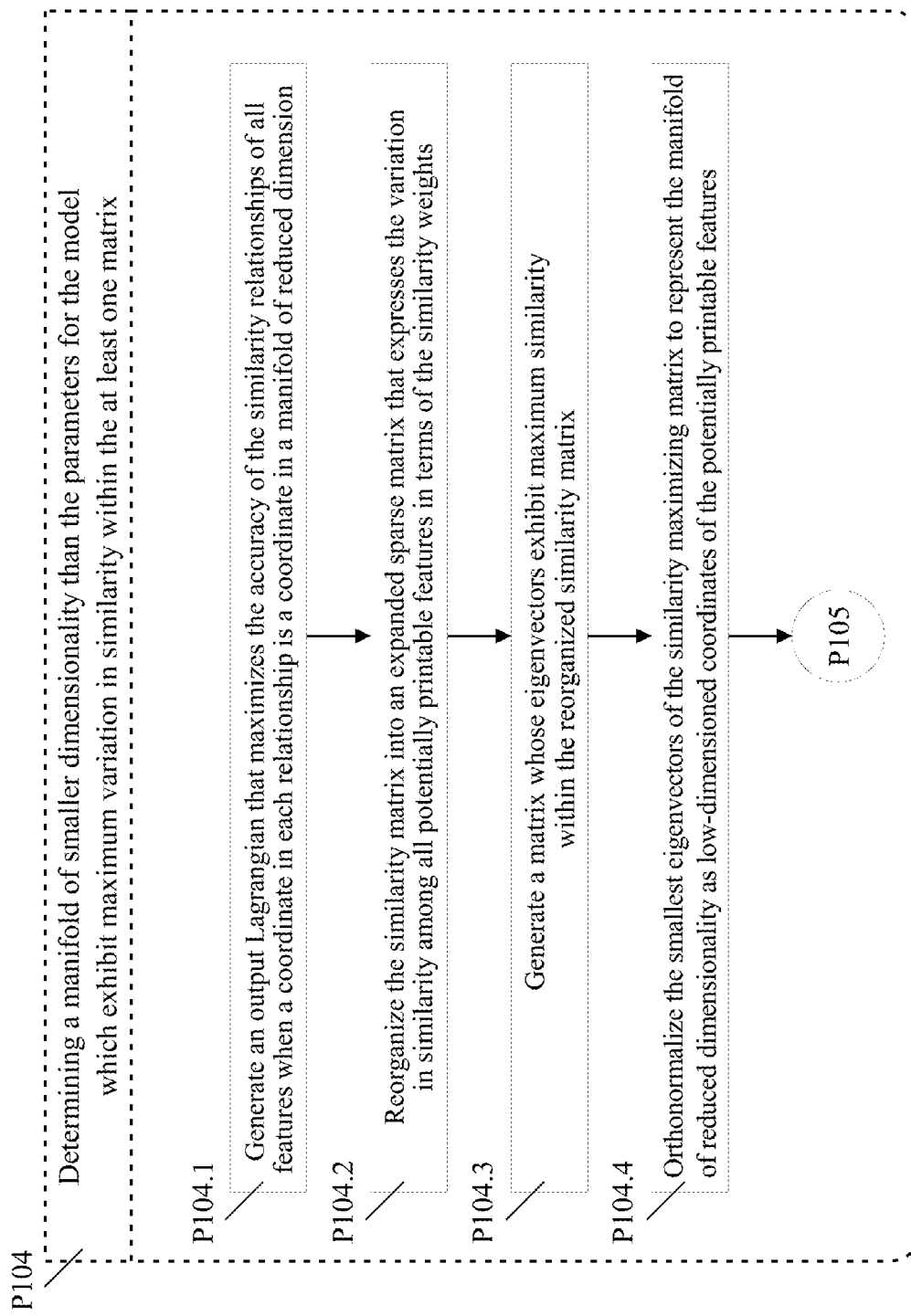
FIG. 17 shows a flow chart illustrating an additional method according to various embodiments.

FIG. 17 shows a flow chart illustrating a more detailed method of performing the process of determining a manifold of smaller dimensionality than the parameters for the model which exhibit maximum variation in similarity within the at least one matrix (Process P104, FIG. 6), according to various embodiments. Process P104 can include the following sub-processes:

P104.1: Generate an output Lagrangian that maximizes the accuracy of the similarity relationships of all features when a coordinate in each relationship is a coordinate in a manifold of reduced dimension;

P104.2: Reorganize the similarity matrix into an expanded sparse matrix that expresses the variation in similarity among all potentially printable features in terms of the similarity weights;

P014.3: Generate a matrix whose eigenvectors exhibit maximum similarity within the reorganized similarity matrix; and P104.4: Orthonormalize the smallest eigenvectors of the similarity maximizing matrix to represent the manifold of reduced dimensionality as low-dimensioned coordinates of the potentially printable features.

Figure 18:
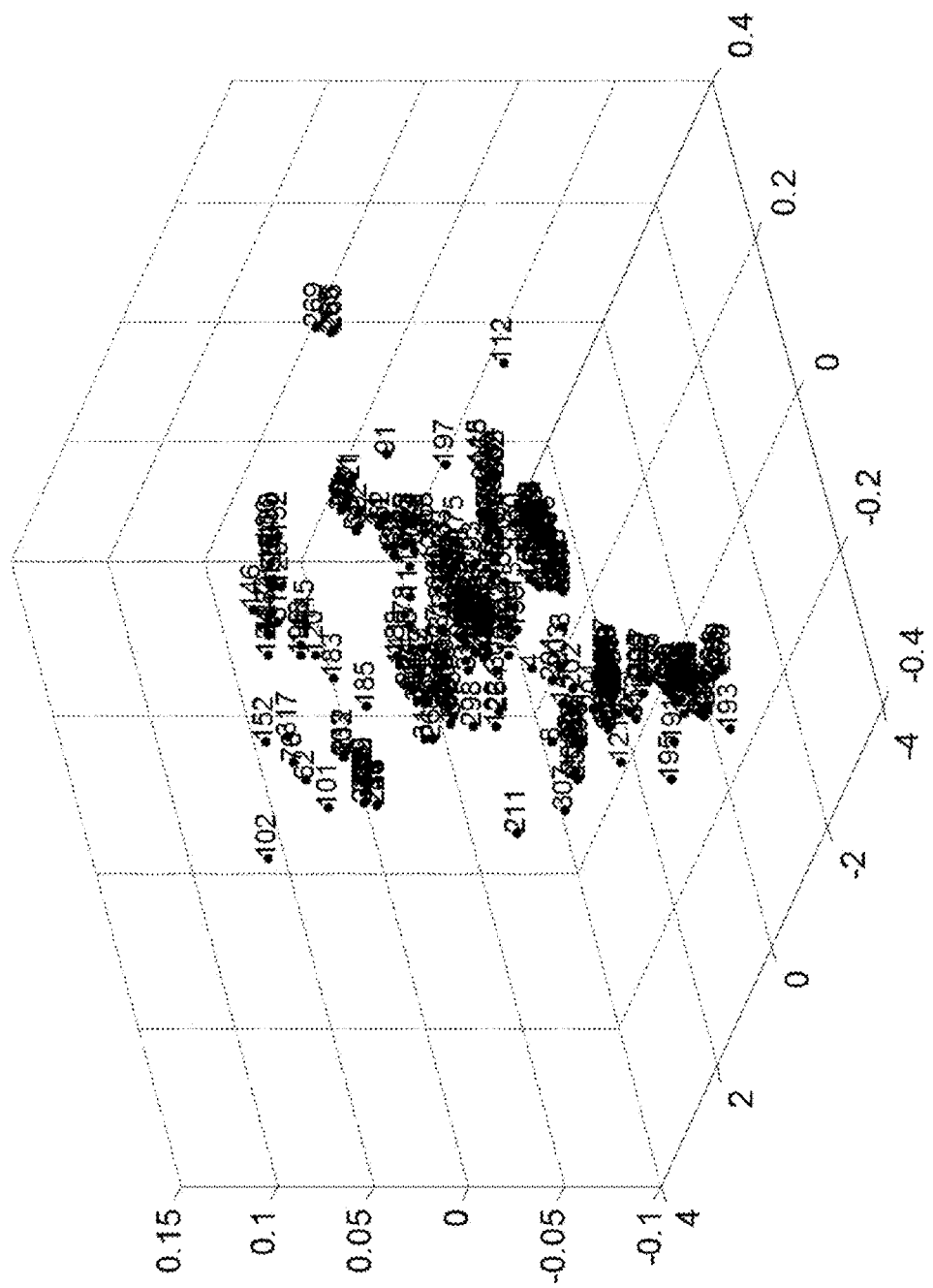
FIG. 18 shows an example three-dimensional graphical depiction of potentially printable features for an advanced integrated circuit (IC) node, plotted according to various embodiments.

FIG. 18 shows an example three-dimensional (3D) graphical depiction of potentially printable features for an advanced integrated circuit (IC) node, plotted according to various embodiments. This 3D depiction is actually a projection of an eleven-dimension (11D) model space. However, even in 3D, the data can be seen to form clusters, arcs, filaments, etc. that would not align well with manifold axes that spanned the entire 11D space. As such, globally varying sub-manifolds for a non-linear model can be used.

Figure 19:
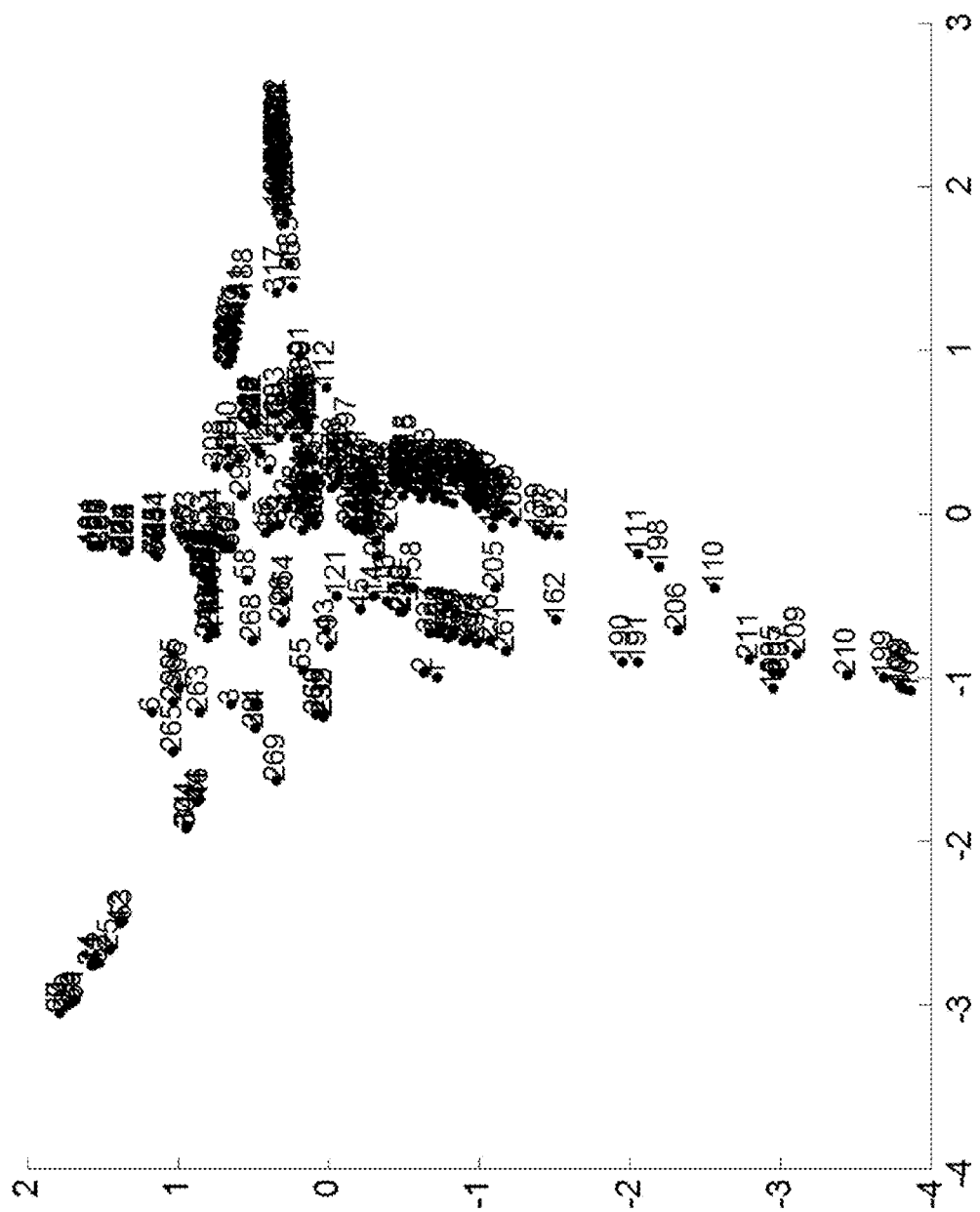
FIG. 19 shows an example two-dimensional graphical depiction of a manifold of reduced dimensionality from the full model space of the potentially printable features of FIG. 18, formed according to various embodiments.

FIG. 19 shows an example two-dimensional graphical depiction of a manifold of reduced dimensionality from the three-dimensional graph of FIG. 18, formed according to various embodiments. According to process P104.4, in this example, six sets of coordinates were selected, where the two most dominant axes are used as the x and y axes in this plot.

Figure 20:
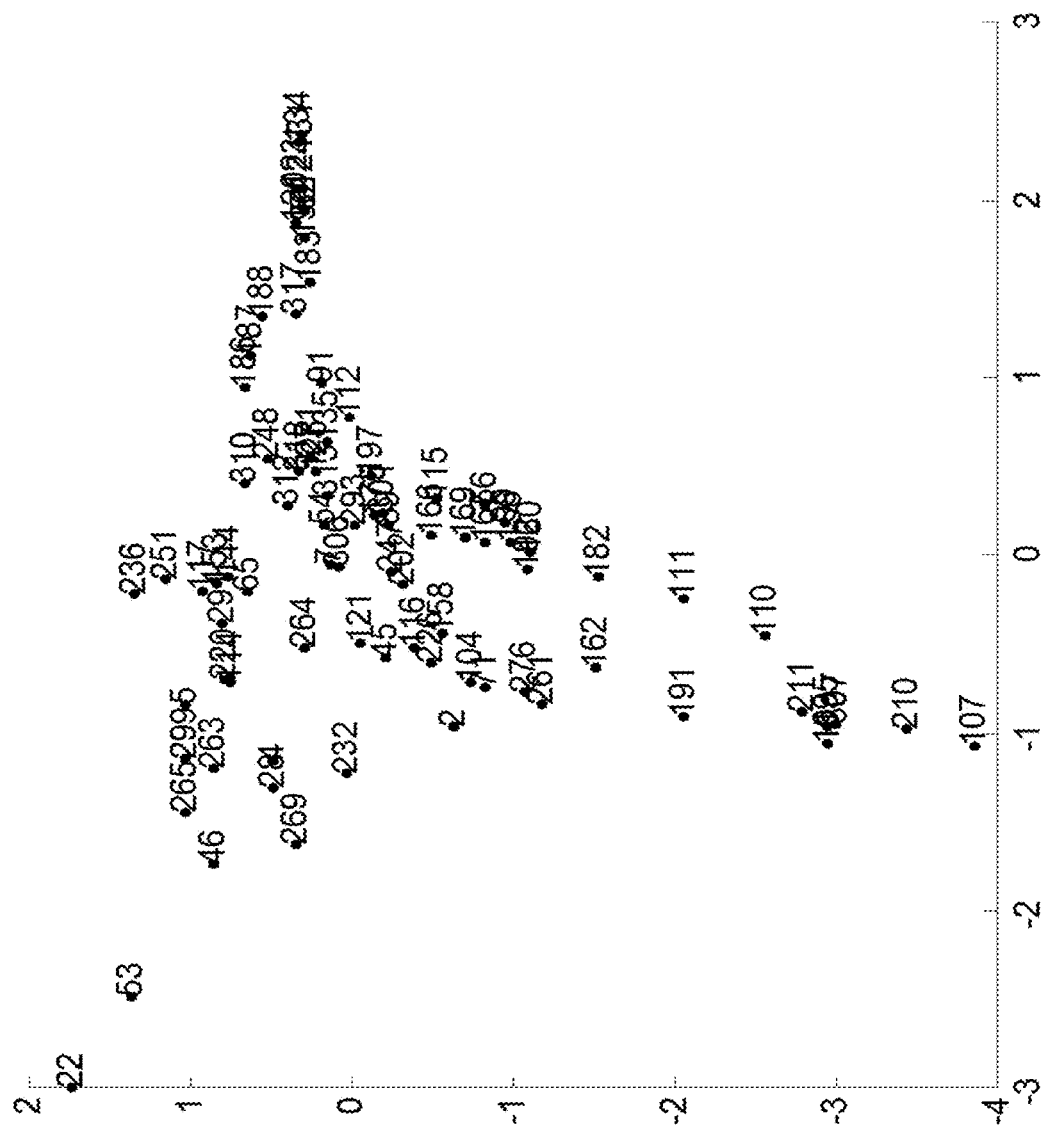
FIG. 20 shows an example two-dimensional graphical depiction of a uniformly sampled set of potentially printable features from the graphical depiction of FIG. 19, formed according to various embodiments.

FIG. 20 shows an example two-dimensional graphical depiction of a uniformly sampled set of potentially printable features from the graphical depiction of FIG. 19, formed according to various embodiments.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

We claim:

1. A computer-implemented method of sampling lithographic content producible by a lithographic printing process, the method performed using at least one computing device, the method comprising:
   identifying parameters for a model of the lithographic printing process;
   assembling a population of design content including potentially printable features that can be printed by the lithographic printing process;
   preparing at least one matrix expressing a similarity between the potentially printable features in terms of the parameters for the model,
   wherein the at least one matrix is formed from similarity weights that express similarity relationships between neighboring features;
   determining a manifold of smaller dimensionality than the parameters for the model which exhibit maximum variation in similarity within the at least one matrix, using the at least one computing device,
   wherein the manifold of smaller dimensionality is determined from low-dimensioned coordinate assignments for the potentially printable features that reproduce similarity relationships between neighboring features within a low-dimensioned space; and
   selecting a sample dataset of the potentially printable features from the manifold.

2. The computer-implemented method of claim 1, wherein the lithographic printing process is used to form an integrated circuit.

3. The computer-implemented method of claim 1, further comprising:
   assembling lithographic feature content in a mask layout associated with the lithographic printing process prior to the identifying of the parameters for the model.

4. The computer-implemented method of claim 2, further comprising:
   defining critical feature widths in the lithographic feature content for a mask associated with the mask layout to print accurately during the lithographic printing process, after the assembling of the lithographic feature content.

5. The computer-implemented method of claim 1, wherein the preparing of the at least one matrix expressing the similarity between the potentially printable features includes preparing a sub-matrix for each potentially printable feature, wherein the sub-matrix expresses a similarity between the printable feature and all printable features neighboring the printable feature.

6. A computer program product comprising program code on a computer readable storage medium, which when executed by at least one computing device, causes the at least one computing device to sample lithographic content producible by a lithographic printing process by performing actions including:
   identifying parameters for a model of the lithographic printing process;
   assembling a population of design content including potentially printable features that can be printed by the lithographic printing process;
   preparing at least one matrix expressing a similarity between the potentially printable features in terms of the parameters for the model,
   wherein the at least one matrix is formed from similarity weights that express similarity relationships between neighboring features;
   determining a manifold of smaller dimensionality than the parameters for the model which exhibit maximum variation in similarity within the at least one matrix,
   wherein the manifold of smaller dimensionality is determined from low-dimensioned coordinate assignments for the potentially printable features that reproduce similarity relationships between neighboring features within a low-dimensioned space; and
   selecting a sample dataset of the potentially printable features from the manifold.

7. The computer program product of claim 6, wherein the lithographic printing process is used to form an integrated circuit.

8. The computer program product of claim 6, wherein the design content includes design parameters.

9. The computer program product of claim 6, which when executed, causes the at least one computing device to further perform:
   assembling lithographic feature content in a mask layout associated with the lithographic printing process prior to the identifying of the parameters for the model.

10. The computer program product of claim 9, which when executed, causes the at least one computing device to further perform:
    defining critical feature widths in the lithographic feature content for a mask associated with the mask layout to print accurately during the lithographic printing process, after the assembling of the lithographic feature content.

11. The computer program product of claim 6, wherein the preparing of the at least one matrix expressing the similarity between the potentially printable features includes preparing a sub-matrix for each potentially printable feature, wherein the sub-matrix expresses a similarity between the printable feature and all printable features neighboring the printable feature.

12. A system comprising:
- at least one computing device configured to calibrate a printing process correction model for a lithographic mask layout by performing actions including:
  - obtaining lithographic feature content in the lithographic mask layout for printing by a lithographic mask using a lithographic printing process;
  - defining dimensions of critical features in the lithographic mask layout to enable the mask to print accurately from the lithographic printing process;
  - identifying parameters for an adjustable model of the lithographic printing process;
  - determining a selection size for a sampling of the critical features to calibrate the adjustable model;
  - preparing at least one matrix expressing a correlation between the critical features and the parameters for the adjustable model;
  - determining a manifold of smaller dimensionality than the set of model parameters which exhibits a corresponding variation in similarity as the at least one matrix;
  - selecting a sample set of equal to the selection size within the manifold of smaller dimensionality;
  - printing the sample set of features using the lithographic printing process;
  - comparing printed dimensions of the critical features in the printed sample set with the dimensions of critical features in the lithographic mask layout; and
  - adjusting the lithographic printing process in response to the comparing indicating that the printed dimensions of the critical features deviate by greater than a threshold amount from the dimensions of the critical features as predicted by the adjustable model.

13. The system of claim 12, wherein the threshold amount is based upon a predetermined tolerance associated with the critical features.

14. The system of claim 12, wherein the critical features include critical widths in the lithographic mask layout, and wherein the corresponding variation includes a maximum variation in similarity.

15. The system of claim 12, wherein the manifold of smaller dimensionality is defined by axes which are the eigenvectors of the at least one matrix that have the largest eigenvalues.

16. The system of claim 12, wherein the determining of the manifold of smaller dimensionality includes selecting a sampling of critical features from the lithographic feature content based upon a closeness to a dominant axis of the at least one matrix.

17. The system of claim 12, wherein the at least one matrix includes at least one a nominal process condition matrix or an off-nominal process condition matrix.

* * * * *